United States Patent
Tanaka et al.

(10) Patent No.: US 7,615,424 B2
(45) Date of Patent: Nov. 10, 2009

(54) LASER IRRADIATION APPARATUS AND METHOD FOR MANUFACTURING SEMICONDUCTOR DEVICE USING THE LASER IRRADIATION APPARATUS

(75) Inventors: Koichiro Tanaka, Isehara (JP); Yoshiaki Yamamoto, Hadano (JP); Nami Kosaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 523 days.

(21) Appl. No.: 11/087,843

(22) Filed: Mar. 24, 2005

(65) Prior Publication Data
US 2005/0214986 A1 Sep. 29, 2005

(30) Foreign Application Priority Data
Mar. 25, 2004 (JP) ............................. 2004-090357

(51) Int. Cl.
*H01L 21/00* (2006.01)
*H01L 21/84* (2006.01)
*H01L 31/036* (2006.01)

(52) U.S. Cl. .................. 438/166; 438/795; 257/64
(58) Field of Classification Search ................ 438/166, 438/795, 776, 797, 156, 157; 257/64
See application file for complete search history.

(56) References Cited

U.S. PATENT DOCUMENTS

| 5,227,838 | A | 7/1993 | Nakanishi et al. | |
|---|---|---|---|---|
| 6,730,550 | B1 * | 5/2004 | Yamazaki et al. | 438/166 |
| 6,730,551 | B2 * | 5/2004 | Lee et al. | 438/191 |
| 6,841,797 | B2 * | 1/2005 | Isobe et al. | 257/64 |
| 7,129,124 | B2 | 10/2006 | Hongo et al. | |
| 7,232,715 | B2 * | 6/2007 | Arao et al. | 438/166 |
| 2003/0171837 | A1 | 9/2003 | Yamazaki et al. | |
| 2007/0037332 | A1 * | 2/2007 | Tanaka | 438/166 |
| 2007/0041410 | A1 | 2/2007 | Hongo et al. | |
| 2007/0111549 | A1 * | 5/2007 | Tanaka | 438/795 |
| 2008/0035618 | A1 * | 2/2008 | Bruland | 219/121.76 |

FOREIGN PATENT DOCUMENTS

| CN | 1480780 | 3/2004 |
|---|---|---|
| JP | 2003-224084 | 8/2003 |

OTHER PUBLICATIONS

Office Action (Application No. 200510071659.7) dated Nov. 30, 2007.

* cited by examiner

*Primary Examiner*—Walter L Lindsay, Jr.
(74) *Attorney, Agent, or Firm*—Eric J. Robinson; Robinson Intellectual Property Law Office, P.C.

(57) ABSTRACT

An object of the present invention is to provide a laser irradiation method being able to control the irradiation position of the laser beam accurately compared with the conventional irradiation method. Another object of the present invention is to provide a method for manufacturing a semiconductor device with the use of the laser irradiation method being able to irradiate a large substrate accurately with the laser beam.

The irradiation position of the laser beam is controlled by using a laser oscillator emitting a laser beam, an optical system for shaping the laser beam into rectangular on the irradiation object, means for moving the irradiation object relative to the laser beam in the long-side direction and the short-side direction of the beam spot, means for moving the irradiation object more slowly in the long-side direction than in the short-side direction, and a laser positioning mechanism.

44 Claims, 15 Drawing Sheets

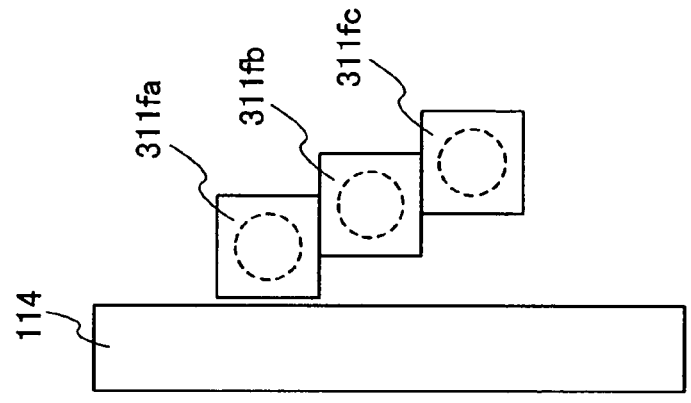
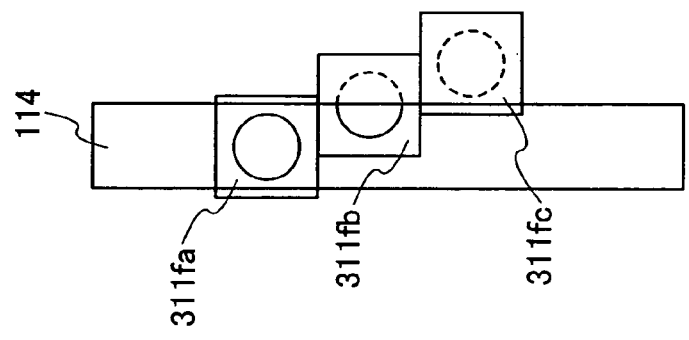
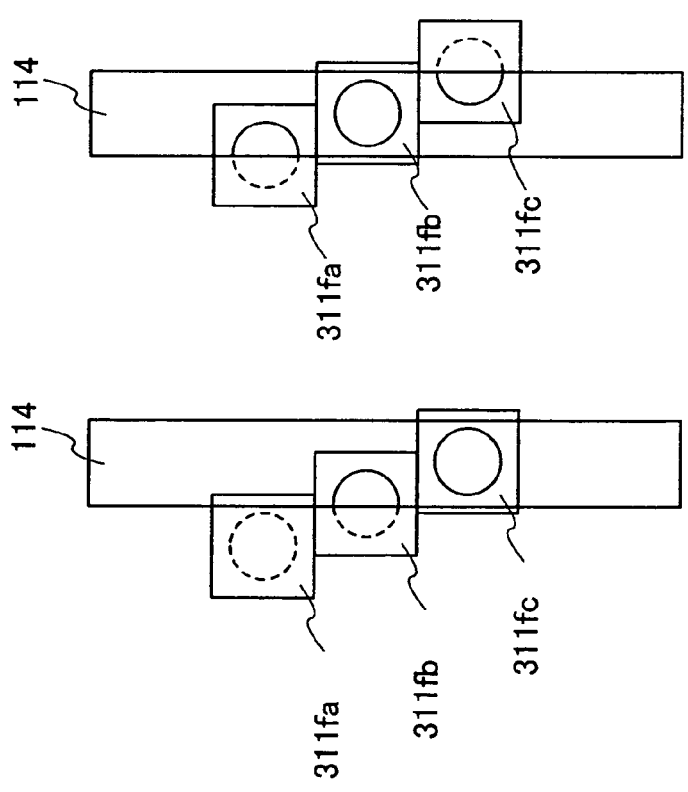

551 driver circuit  550 pixel portion

LASER IRRADIATION APPARATUS AND METHOD FOR MANUFACTURING SEMICONDUCTOR DEVICE USING THE LASER IRRADIATION APPARATUS

BACKGROUND OF THE INVENTION

1. Field of the Invention

The present invention relates to a laser irradiation apparatus to irradiate an irradiation object with a laser beam and moreover to a method for manufacturing a semiconductor device with the use of the laser irradiation apparatus.

2. Related Art

In recent years, a technique to manufacture a thin film transistor (TFT) over a substrate has made a great progress, and application development to an active matrix display device has been advanced. In particular, a TFT formed using a poly-crystalline semiconductor film is superior in field-effect mobility (also referred to as mobility simply) to a TFT formed using a conventional non-single crystal semiconductor film, and therefore high-speed operation becomes possible when the TFT is formed using the poly-crystalline semiconductor film. For this reason, it has been tried to control a pixel by a driver circuit formed over the same substrate as the pixel, which was controlled conventionally by a driver circuit provided outside the substrate.

A substrate used in a semiconductor device is expected to be a glass substrate in terms of cost. However, the glass substrate is inferior in heat resistance and easy to change in shape due to the heat when the process temperature is high. Therefore, when the TFT using the poly-crystalline semiconductor film is formed over the glass substrate, a laser annealing method is employed to crystallize a semiconductor film formed over the glass substrate in order to prevent the glass substrate from changing in shape due to the heat.

Compared with another annealing method which uses radiation heat or conduction heat, the laser annealing has advantages that the processing time can be shortened drastically and that a semiconductor film over a substrate can be heated selectively and locally so that the substrate is hardly damaged thermally.

In general terms, when the semiconductor film is crystallized by the laser annealing method, a beam spot is shaped into linear or rectangular by an optical system. The mass productivity can be enhanced by performing the laser irradiation to the irradiation object effectively in such a way that the beam spot is moved relative to the irradiation object in two directions of a short-side direction and a long-side direction of the beam spot. The short-side direction means a direction parallel with a short side of a rectangular beam spot, and the long-side direction means a direction parallel with a long side of the rectangular beam spot.

In the laser annealing method, it is important to control the irradiation position of the laser beam to the irradiation object. Conventionally, in order to control the irradiation position of the laser beam accurately, a technique is employed in which a marker to be the standard is provided to the irradiation object and the irradiation position is controlled based on the marker by using image processor means including a CCD (Charge Coupled Device) camera, a computer, and the like (for example refer to patent document 1).

[Patent Document] Japanese Patent Laid-Open No. 2003-224084

However, although the image processor means such as the CCD camera determines the irradiation position of the laser beam once based on the marker provided to the irradiation object, the irradiation position is gradually displaced from the region to be irradiated with the laser beam while repeating the laser irradiation. This is because a moving device such as a stage to be used in the laser irradiation does not have the absolute accuracy.

Although this displacement is very small just after the start of the irradiation, the displacement increases with the repeated movement of the stage. For example, when the laser irradiation position is controlled on a large substrate having a length of 1 m or more on a side, the displacement due to the movement of the stage appears remarkably and this leads to a significant problem.

For example, when an amorphous semiconductor film formed over a substrate is crystallized by the laser irradiation, a problem causes that a non-crystallized region or a repeatedly-irradiated region is formed due to the displacement of the laser irradiation position. It is considered that when TFTs are manufactured using the semiconductor film crystallized thus, the electrical characteristic varies between the TFTs and the reliability is lowered.

Moreover, when the amorphous semiconductor film is crystallized by the laser irradiation, the irradiation object is moved relative to the laser beam at a constant speed in two directions in order to grow the crystal in the scanning direction of the laser beam. In this case, when the irradiation position of the laser beam is controlled in two directions by the image processor means including a CCD camera, it takes much time to control the irradiation position takes much time, and therefore the processing speed becomes slow. When the moving speed of the stage is fast, highly sophisticated image processor means is necessary to control the irradiation position of the laser beam.

SUMMARY OF THE INVENTION

Consequently, in view of the above problem, an object of the present invention is to provide a laser irradiation apparatus being able to control the irradiation position of the laser beam more accurately than before. Moreover, another object of the present invention is to provide a method for manufacturing a semiconductor device by performing the accurate laser irradiation to a semiconductor formed over a large substrate.

It is considered that the above problem results from the small number of times of determining the irradiation position and from the same moving speed of the irradiation object both in the short-side direction and the long-side direction of the beam spot.

Consequently, in the present invention, a plurality of markers are provided in accordance with the irradiation position of the laser beam so as to increase the opportunity to determine the irradiation position correctly. Moreover, in the present invention, the moving speed of the beam spot in the short-side direction and the long-side direction is decided separately in consideration of the different purpose of the respective directions. Specifically, the beam spot is scanned at high speed in the short-side direction of the beam spot because the accurate control is not necessary, and the beam spot is scanned at low speed in the long-side direction because the accurate control is necessary to determine the irradiation position.

It is noted that the laser annealing in the present invention indicates a technique to crystallize a damaged layer or an amorphous layer in a semiconductor substrate or a semiconductor film, a technique to crystallize an amorphous semiconductor film formed over a substrate, and a technique to anneal a non-single crystal semiconductor. Moreover, the laser annealing includes a technique applied to planarize or modify the surface of the semiconductor substrate or the semiconductor film.

A laser irradiation apparatus of the present invention is characterized that a laser oscillator emitting a laser beam, an optical system for shaping the laser beam into an elongate beam spot having a short side and a long side on a surface of an irradiation object, means for moving the irradiation object relative to the laser beam in the short-side direction and the long-side direction of the beam spot, means for moving the irradiation object relative to the laser beam more slowly in the long-side direction than in the short-side direction of the beams spot, and a laser positioning mechanism, wherein the laser positioning mechanism comprises means for controlling the movement of the irradiation object relative to the laser beam in the long-side direction of the beam spot.

The laser positioning mechanism comprises at least a second laser oscillator for emitting a second laser beam, a photodetector for detecting the second laser beam, and means for controlling an irradiation position of a first laser beam by reading a position of a marker formed over the irradiation object. The laser positioning mechanism works with a scanning stage and controls start and stop of the scanning stage when moving the scanning stage.

In this specification, the elongate shape may be any shape when it has a short side and a long side in the first direction and the second direction which is perpendicular to the first direction. For example, it may be a rectangular shape, a linear shape, or an elliptical shape. In the present invention, a short-side direction of the elongate beam spot means a direction parallel to the short side of the elongate beam spot and a long-side direction of the elongate beam spot means a direction parallel to the long side of the elongate beam spot. For example, in the case of the elliptical beam spot, the long-side direction is a direction parallel to the line connecting two different points on the ellipse that are the farthest each other and the short-side direction is a direction perpendicular to the long-side direction.

In the laser irradiation apparatus of the present invention, the laser annealing is performed by irradiating the irradiation object with a first laser beam shaped into rectangular, linear, or elliptical while moving the irradiation object relative to the first laser beam in the short-side direction of the first laser beam. Accordingly, it is necessary to control accurately the movement of the beam spot in the long-side direction in order to irradiate the correct position in the irradiation object with the first laser beam. Consequently, the laser positioning mechanism of the present invention is characterized that it controls the movement of the first beam spot in the long-side direction.

To read the position of the marker with the use of the laser positioning mechanism, for example a surface of the irradiation object which the marker is formed is irradiated with the second laser beam, and then the second laser beam transmitting through the marker is detected. In this case, a laser beam that transmits through the marker formed over the irradiation object but that does not transmit the other parts of the irradiation object is used as the second laser beam with which the surface of the irradiation object over which the marker is formed is irradiated. For example, in the case of using the semiconductor film over the glass substrate, since the marker is formed by removing the semiconductor film selectively, the laser beam that transmits through the glass substrate but that is absorbed in the semiconductor film is used.

To read the position of the marker, not only the laser beam transmitting through the marker formed over the irradiation object but also the laser beam reflected on the marker may be detected. In the latter case, when the semiconductor film is formed over the glass substrate, the laser beam having large gap in reflectance between the glass substrate and the semiconductor film may be used.

The laser positioning mechanism controls the movement of the irradiation object in the long-side direction of the first beam spot, that is, one of the two moving directions. In this case, the marker formed over the irradiation object preferably has a shape that can be easily detected by the second laser beam when the irradiation object is moved in the long-side direction of the first beam spot. For example, the marker is preferably made longer in the short-side direction of the first beam spot.

In the present invention, the scanning speed is set separately in consideration of the role of moving the beam spot in the short-side direction and the long-side direction of the beam spot. When the irradiation object is moved relative to the first laser beam in the short-side direction, the scanning speed is preferably in the range of 100 mm/s to approximately 20 m/s. Within this range, the large crystal grains can be obtained by the laser annealing. When the scanning speed exceeds approximately 20 m/s, the crystal does not grow along the scanning direction of the laser beam. On the other hand, when the irradiation object is moved relative to the first laser beam in the long-side direction, the scanning speed is preferably less than 100 mm/s because high positioning accuracy is required.

In the case of the laser annealing, the irradiation object provided over the scanning stage may be moved while fixing the first laser beam, or the first laser beam may be moved while fixing the irradiation object. Moreover, both of the first laser beam and the irradiation object may be moved in the laser annealing.

In the present invention, the laser irradiation position can be controlled accurately by using at least two laser positioning mechanisms. Specifically, the markers are formed at opposite ends of the irradiation object and the marker in one end is read for every scanning of the laser beam. Thus, the irradiation position can be controlled every time the laser beam is scanned. Although the two or more laser positioning mechanisms may be provided in any way, it is preferable to provide them on a straight line so as to sandwich the first laser beam.

In the present invention, the large crystal grain extending long in the scanning direction is formed by using the continuous wave laser beam as the first laser beam emitted from the first laser oscillator The first laser oscillator may be a YAG laser, a YVO$_4$ laser, a ceramic laser, a GdVO$_4$ laser, a YLF laser, or an Ar laser. Moreover, the laser beam emitted from a pulsed laser oscillator having the pulse repetition rate as high as 10 MHz or more can be used as the first laser beam.

In the present invention, the irradiation object can be irradiated homogeneously with the laser beam by providing a plurality of markers to the irradiation object in accordance with the laser irradiation position and by controlling the laser irradiation position using the laser positioning mechanism. Moreover, the whole surface of the semiconductor film formed over the large substrate can be annealed homogeneously when the laser irradiation is performed while controlling the irradiation position accurately only in one direction.

BRIEF DESCRIPTION OF THE DRAWINGS

In the accompanying drawings:

FIGS. 5A to 5D are drawings for showing the condition to detect the laser beam transmitted through the marker;

DETAILED DESCRIPTION OF THE INVENTION

EMBODIMENT MODE

Figure 1:
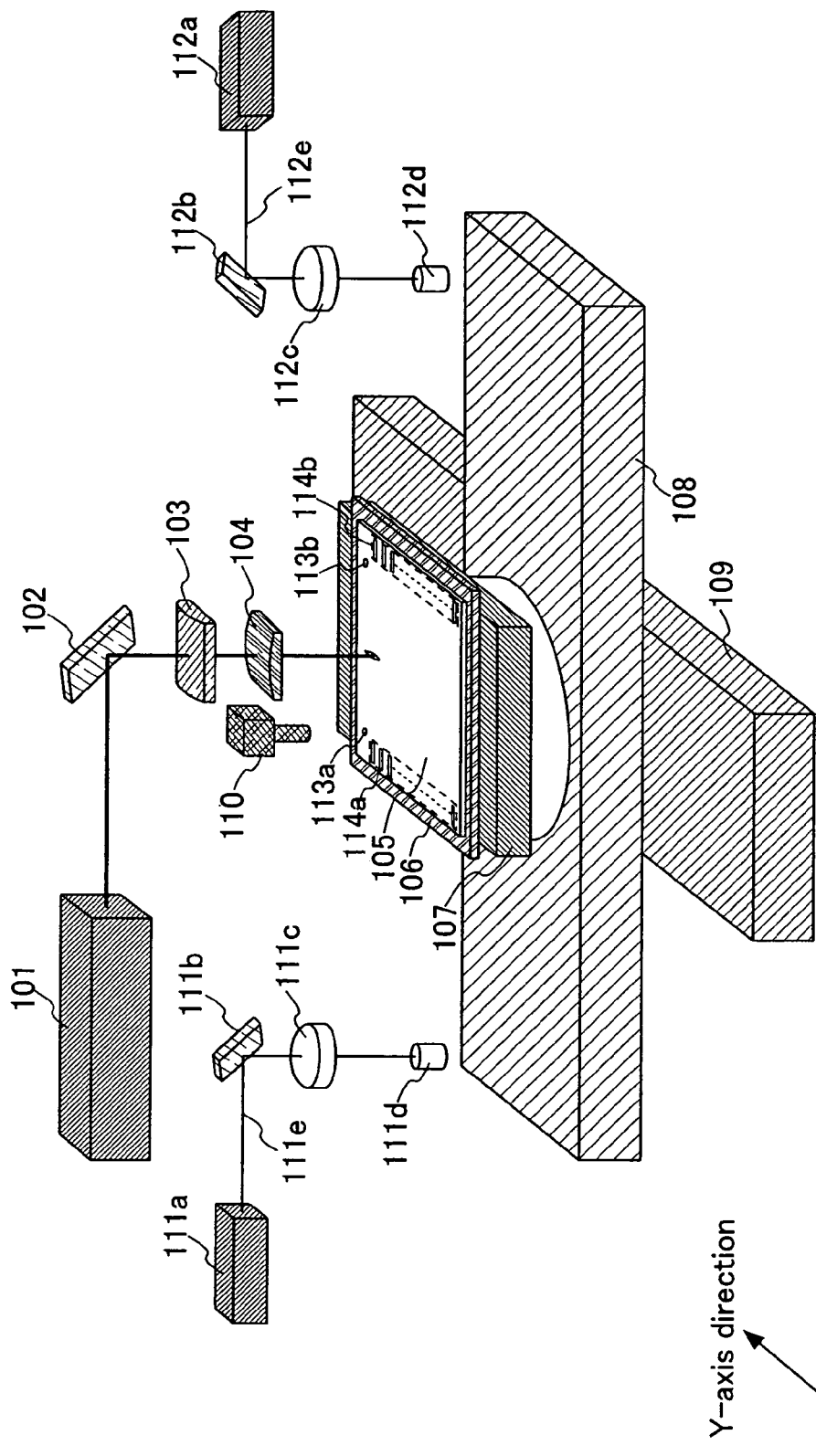
FIG. 1 is a drawing for showing a laser irradiation apparatus of the present invention.

Embodiment modes and embodiments of the present invention are hereinafter described with reference to drawings. Since the present invention can be embodied in many different modes, it is easily understood by those skilled in the art that the modes and the details of the present invention can be changed and modified in various ways unless such changes and modifications depart from the scope and the content of the present invention. Therefore, the present invention is not limited to the description of the embodiment modes and the embodiments. The same reference numerals are given to the same parts throughout the drawings, and the description to the same parts is omitted.

Embodiment Mode 1

With reference to drawings, this embodiment mode describes an example of a laser irradiation apparatus and a method for manufacturing a semiconductor device with the use of the laser irradiation apparatus of the present invention.

In this embodiment mode shown in FIG. 1, the irradiation object is a glass substrate 106 with a semiconductor film 105 formed thereover. After forming the semiconductor film 105 over the glass substrate 106, circular markers 113a and 113b and rectangular markers 114 are formed selectively by mask patterning or high-power laser irradiation. In this embodiment mode, the same number of rectangular markers 114 as the scanning times of the laser beam on the substrate 106 are provided at opposite ends of the substrate 106. It is noted that the substrate 106 may be any kind of substrate when it has the light-transmitting property. For example, a substrate made of plastic can be used.

In the present embodiment mode, the markers 114 are formed by selectively removing the semiconductor film 105 formed over the substrate 106. Then, laser beams 111e and 112e that transmit through the glass substrate 106 but that don't transmit through the semiconductor film 105 are made incident into the markers 114. At the markers 114, the laser beams 111e and 112e transmit through the glass substrate 106 because the semiconductor film 105 is removed. These laser beams 111e and 112e transmitted through the substrate 106 are detected by photodetectors 111d and 112d respectively. The photodetectors 111d and 112d convert the light into electricity and measure the current value. These photodetectors respond when the measured current value exceeds the predetermined value.

On the other hand, when the laser beams 111e and 112e are incident into the regions where the markers 114 are not provided, that is, where the semiconductor film 105 is formed, the incident laser beams don't transmit through the semiconductor film 105, and therefore the laser beams are not detected by the photodetectors 111d and 112d. Thus, the irradiation position on the substrate can be determined correctly by using the laser beam and the photodetector.

Although this embodiment mode described the example of the photodetector which detects the laser beam by converting the light into electricity, the present invention is not limited to this, and any kinds of photodetectors may be used when they can detect the light. For example, a photodetector which detects the light by converting the light into heat may be used. In this case, the photodetector uses the physical change of the material by the heat generated when the light is absorbed in the material. This photodetector can detect the light by the temperature change when the photodetector is irradiated with the laser beams 111e and 112e.

A laser beam emitted from a laser oscillator 101 is reflected by a mirror 102 so that its traveling direction is changed to be perpendicular to the semiconductor film 105 formed over the glass substrate 106. After that, the laser beam is converged in two directions respectively by two cylindrical lenses 103 and 104 and is shaped into linear on the semiconductor film 105. Here, the laser beam emitted from the laser oscillator 101 is referred to as the first laser beam and the beam spot of the first laser beam formed over the semiconductor film 105 is referred to as the first beam spot.

In this embodiment mode, the first beam spot is preferably shaped into linear, elliptical, or rectangular. When the first beam spot is linear, elliptical, or rectangular, the laser annealing can be performed effectively by moving the first laser beam relatively from one end of the glass substrate 106 to the other end thereof in a short-side direction of the first beam spot. The laser oscillator 101 may be, for example, a YAG laser, a YVO$_4$ laser, a ceramic laser, a GdVO$_4$ laser, a YLF laser, an Ar laser, or the like. Moreover, the laser beam emitted from the pulsed laser having the repetition rate as high as 10 MHz or more can be used as the first laser beam.

In this embodiment mode, the glass substrate 106 is mounted over a rotating stage 107, and the rotating stage 107 is provided over an X-axis stage 108 moving in an X-axis direction and a Y-axis stage 109 moving in a Y-axis direction. The rectangular markers 114 are formed over the glass substrate 106 by patterning the semiconductor film 105 as described above.

In the case of the annealing performed by irradiating the semiconductor film 105 with the first laser beam, the annealing can be performed effectively by moving the glass substrate 106 over the X-axis stage back and forth in the short-side direction of the first beam spot (X-axis direction). In this case, after the first laser beam is scanned once in the X-axis direction from one end of the semiconductor film 105 to the other end thereof, the Y-stage is slid in the Y-axis direction by the width of the large crystal grain region obtained by one scanning of the first laser beam in the X-axis direction. The width of the large crystal grain region is hereinafter referred to as $d_1$. After that, the first laser beam is scanned in an opposite direction of the X-axis direction, and then the Y-stage is slid by $d_1$ in the Y-axis direction. By repeating the above operation, the whole surface of the semiconductor film 105 can be irradiated with the first laser beam effectively (refer to FIG. 2).

The irradiation position of the first laser beam is controlled by stopping the Y-axis stage when the above-mentioned laser beam 111e or 112e is detected by the photodetector 111d or 112d after transmitting through one of the markers 114a to 114f. In other words, the moving distance in the Y-axis direction can be controlled by any value by setting the center-to-center distance between the markers 114a and 114d, 114d and 114e, 114b and 114c, and 114c and 114f in FIG. 2.

In this case, it is preferable that the center-to-center distance of the markers is set to $d_1$. By controlling the moving distance in the Y-axis direction based on these markers 114a to 114f, the Y-axis stage 109 moves by intervals of $d_1$, and the laser irradiation can be performed to the whole surface of the semiconductor film 105. The center-to-center distance of the markers may be determined appropriately by a practitioner in accordance with the diameter of the beam spot or the width of the large crystal grain region.

When the laser beams 111e and 112e respectively emitted from the laser oscillators 111a and 112a are incident into these markers 114, the incident laser beams are detected by the photodetectors 111d and 112d. The laser beams 111e and 112e are referred to as the second laser beams, and the beam spot of the second laser beam is referred to as the second beam spot.

The laser oscillators 111a and 112a emit the laser beams having the wavelengths of green or blue with an output of 1 mW or less that is not absorbed in the glass substrate but that is absorbed in the semiconductor film. The laser beams 111e and 112e respectively emitted from the laser oscillators 111a and 112a are reflected on mirrors 111b and 112b so that the traveling directions of the laser beams 111e and 112e are changed to be perpendicular to the glass substrate 106. After that, the laser beams 111e and 112e are shaped into circular beam spots by objective lenses 111c and 112c. In this embodiment mode, the system including the laser oscillator 111a, the mirror 111b, the objective lens 111c, and the photodetector 111d is referred to as a laser positioning mechanism 111. In the same way, the system including the laser oscillator 112a, the mirror 112b, the objective lens 112c, and the photodetector 112d is referred to as a laser positioning mechanism 112.

At least two laser positioning mechanisms are used because it is necessary to provide means for determining the irradiation positions at opposite ends of the glass substrate 106 over the X-axis stage 108 which moves the glass substrate 106 back and forth in the X-axis direction.

Although each marker 114 has the rectangular shape in this embodiment mode, the shape is not limited to this, and the marker may be linear or circular. Moreover, the shape of the second beam spot for controlling the irradiation position is not limited to circular, and it may be elliptical or rectangular. However, the length of the second beam spot in the Y-axis direction is made much shorter than the width of the marker 114 in order to keep high positioning accuracy.

Since it is necessary to scan the first beam spot while keeping the same intervals between the scanning lines, the direction in which the irradiation position is controlled correctly using the marker 114 is the long-side direction of the first beam spot, which is the Y-axis direction. For this reason, the marker 114 is preferably made much longer in the X-axis direction than in the Y-axis direction because the second laser beam is easily detected when the substrate moves in the Y-axis direction.

The scanning speed when the substrate moves in the X-axis direction is preferably from 100 mm/s to 20 m/s. Within this range, the large crystal grain region can be obtained. On the other hand, the scanning speed of the substrate in the Y-axis direction may be determined so that the laser positioning mechanism can read the marker to decide the irradiation position accurately. In this embodiment mode, the scanning speed in the Y-axis direction is 100 mm/s or less.

When determining a starting position for irradiating with the first laser beam, a fixed CCD camera 110 and two markers 113a and 113b are used to correct the displacement of the substrate in the rotating direction. In this method, which has been conventionally used, the rotating angle of the substrate to the marker is corrected using the markers 113a and 113b, and the starting position of the irradiation is determined. To correct the displacement of the substrate in the rotating direction, the substrate 106 is moved until the fixed CCD camera 110 detects the marker 113a and then coordinates of $X_a$ and $Y_a$ of the marker 113a are obtained. Next, the substrate 106 is moved until the CCD camera 110 detects the marker 113b and coordinates of $X_b$ and $Y_b$ of the marker 113b are obtained. By moving the rotating stage 107 so that $Y_b - Y_a = 0$, the displacement of the stage in the rotating direction can be corrected.

In this embodiment mode, the laser irradiation apparatus is set so that the second laser beam 111e is incident into the marker 114a when the laser irradiation starting position is determined by using the markers 113a and 113b. This case is described with reference to FIG. 2.

Figure 2:
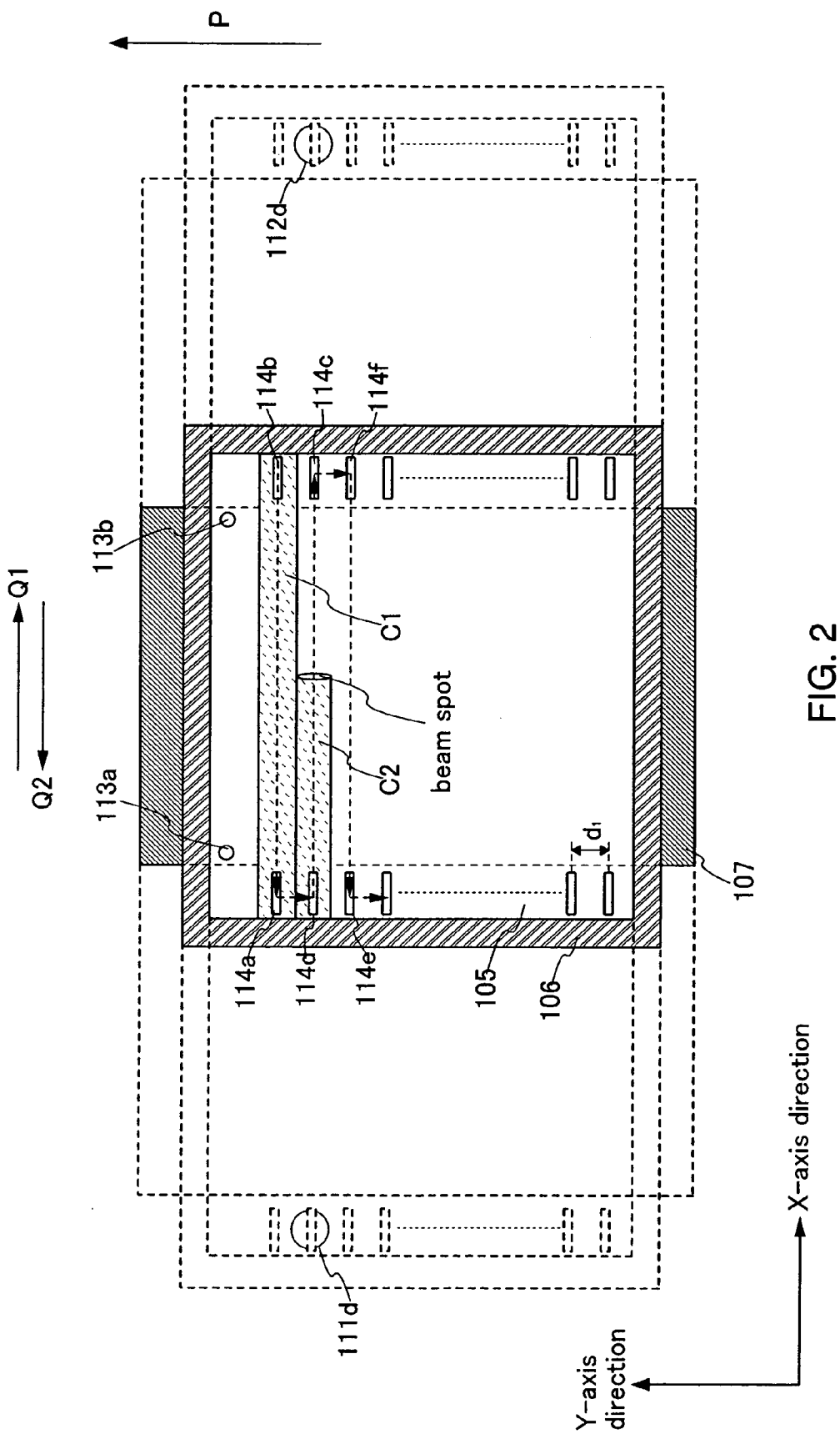
FIG. 2 is a drawing for showing a laser irradiation method of the present invention.
Figure 3:
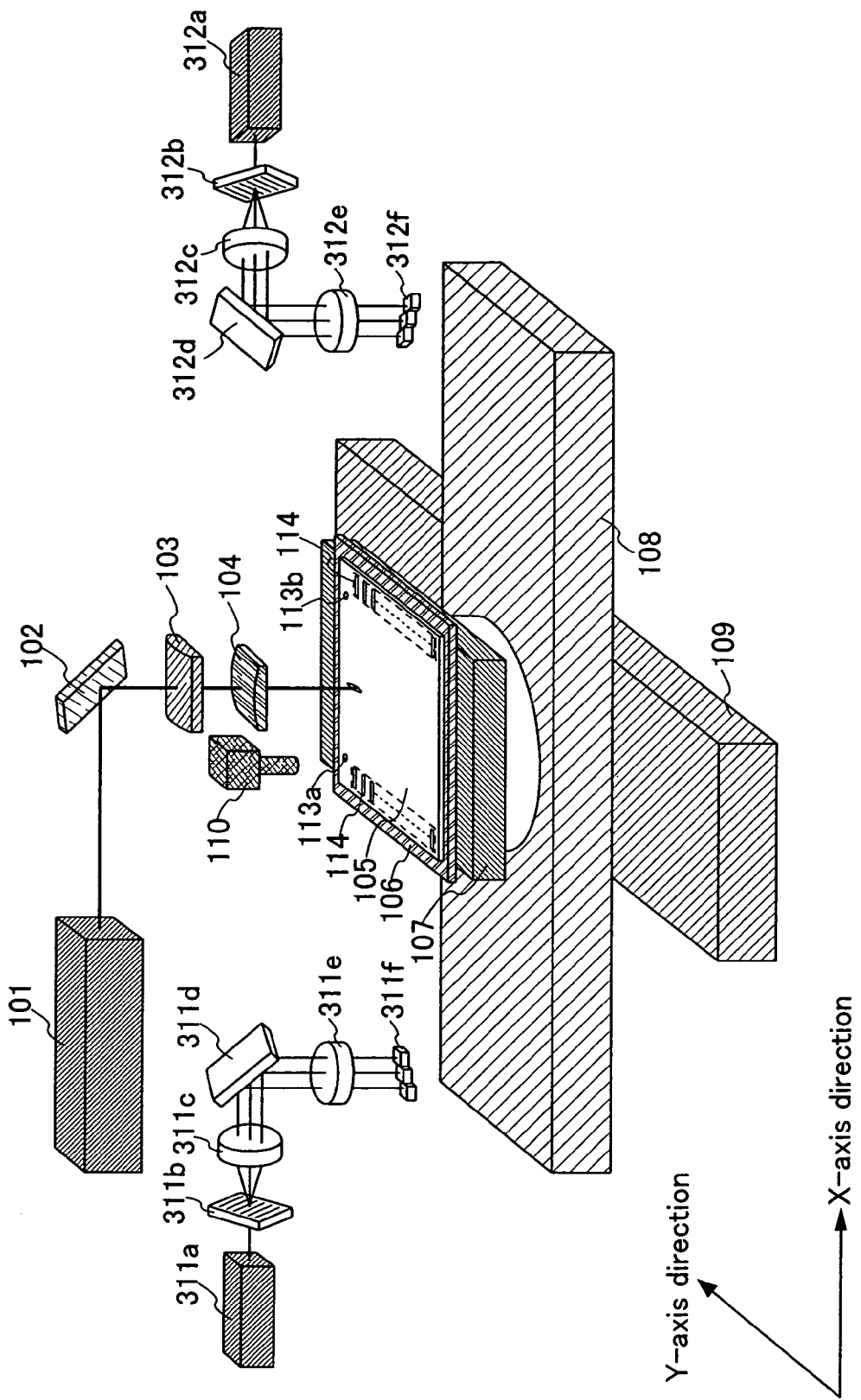
FIG. 3 is a drawing for showing a laser irradiation apparatus of the present invention.

In FIG. 2, when the second laser beam 111e is incident into the marker 114a, the laser beam 111e transmits through the substrate because the semiconductor film is removed at the marker 114a. The transmitted laser beam is detected by the photodetector 111d provided under the substrate, and the Y-axis stage 109 stops when the laser beam is detected. Then, the X-axis stage starts to move at the same time as the Y-axis stage stops.

First, a part C1 of the semiconductor film 105 is annealed by performing the laser irradiation while moving the X-axis stage in a Q1 direction shown in FIG. 2. In this case, since the substrate moves in the X-axis direction while fixing the first beam spot, the moving direction of the substrate is opposite to the moving direction of the beam spot. The substrate starts to move from one end of the X-axis stage, and the substrate accelerates gradually. When the scanning speed of the substrate reaches the predetermined value, the first laser beam is incident into the semiconductor film 105, and thus the annealing is performed. In other words, the same scanning speed is kept in the X-axis direction during the period for irradiating the semiconductor film with the first laser beam. When the laser irradiation is performed at the constant speed, the semiconductor film can be annealed homogeneously, and accordingly the semiconductor film is crystallized homogeneously.

After the first beam spot is scanned on the part C1 in the semiconductor film, the substrate gradually decelerates and stops at the other end of the X-axis stage. In the scanning to the part C1, the starting position and the stopping position of the stage are illustrated with a dotted line in FIG. 2. Moreover, the annealing direction by the first beam spot is illustrated with an arrow of a dotted line.

Next, the Y-axis stage starts to move simultaneously with the stopping of the X-axis stage. The Y-axis stage moves in the long-side direction of the first beam spot, that is, the Y-axis direction (P-direction in FIG. 2). When the second laser beam 112e incident into the marker 114c is detected by the photodetector 112d, the Y-axis stage 109 stops. Then, by moving the X-axis stage 108 in a Q2 direction, a part C2 is annealed in a direction opposite to that when annealing C1. After the annealing to the part C2 is completed and the X-axis stage is stopped, the Y-axis stage moves in the P-direction again. When the second laser beam 111e incident into the marker 114e is detected by the photodetector 111d, the Y-axis stage 109 stops. Then, the X-axis stage starts to move in the Q1 direction again.

By repeating this operation, the whole surface of the semiconductor film 105 formed over the large glass substrate 106 can be irradiated with the first laser beam. In the case of performing the laser annealing all over the substrate, since the accurate control of the irradiation position is necessary in only one direction of the Y-axis direction, it is possible to perform the laser annealing effectively by reading the correct irradiation position in shorter time than the conventional method in which the position has been controlled in two directions by using the image processor means such as the CCD camera.

Figure 9:
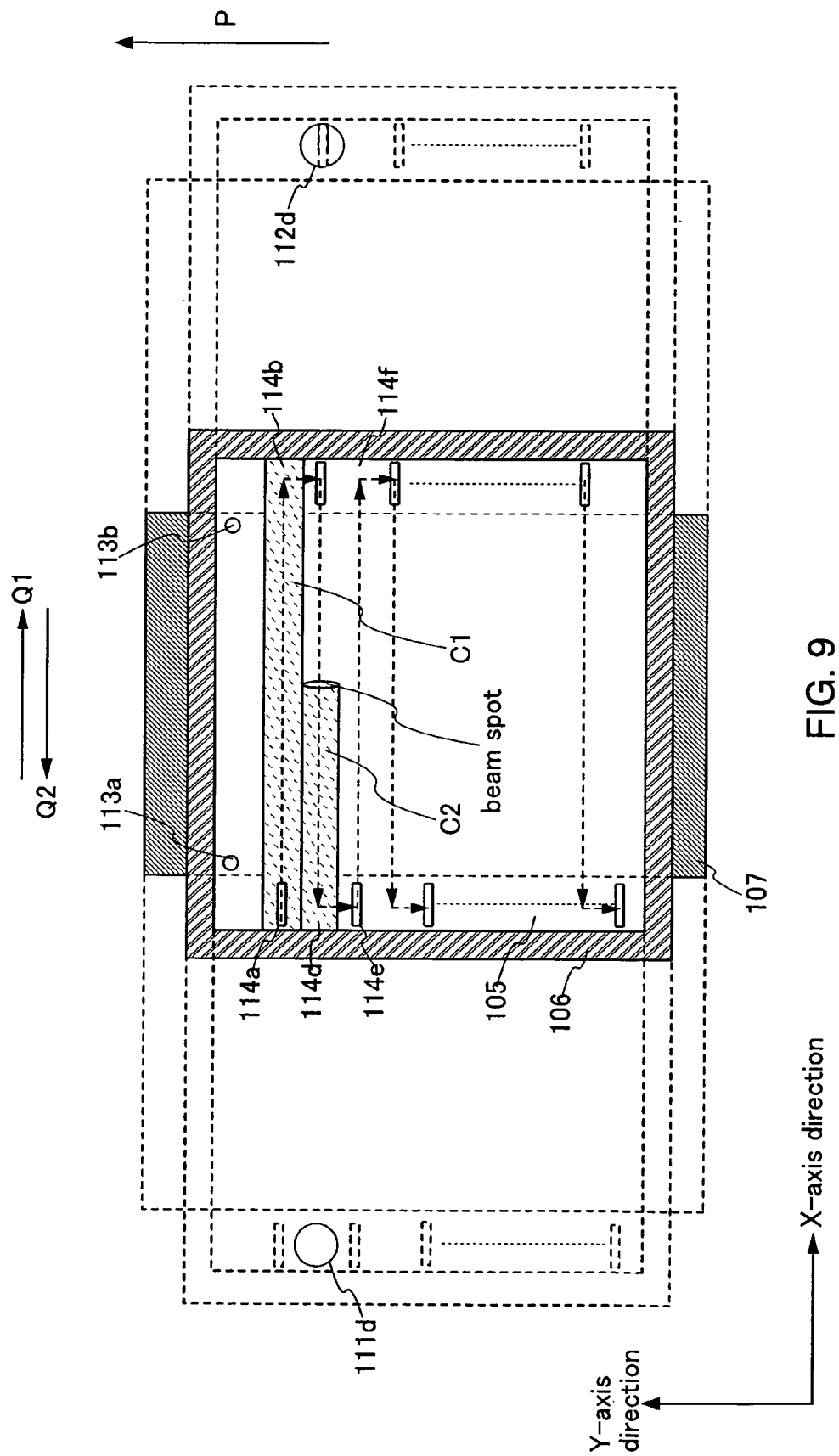
FIG. 9 is a drawing for showing a laser irradiation method of the present invention.

Although the same number of rectangular markers 114 as the scanning times of the first laser beam are provided at the opposite ends of the substrate in this embodiment mode (FIG. 2), the present invention is not limited to this. The markers 114 may be arranged on the substrate in any way when the irradiation position of the first laser beam can be controlled and when the homogeneous annealing can be performed to the whole surface of the substrate. For example, as shown in FIG. 9, the markers 114 may be arranged alternately at the opposite ends of the substrate in the X-axis direction. Since the row of the markers to be read differ at opposite ends by every scanning in X-axis direction in the above-mentioned laser irradiation method, the irradiation position can be controlled in the same way even in the case shown in FIG. 9 in which the markers 114 are formed alternately in the X-axis direction. Moreover, since the number of markers 114 in FIG. 9 is a half of that in FIG. 2, the processing speed increases.

Although moves of the X-axis stage and the Y-axis stage are not synchronized in this embodiment mode, they may be synchronized when the semiconductor film can be irradiated with the first laser beam homogeneously. For example, the X-axis stage may be moved while the Y-axis stage is moved. In this case, the Y-axis stage may be moved while the X-axis stage accelerates or decelerates. Alternatively, the Y-axis stage may be moved simultaneously with the X-axis stage during the annealing in order to adjust finely the position of the beam spot. When the X-axis stage and the Y-axis stage are moved in synchronization, the processing time can be shortened further.

Moreover, although the present embodiment mode described the constitution to irradiate the irradiation object with the first laser beam while moving the scanning stage with the substrate mounted thereover, the laser irradiation may be performed by moving only the first laser beam or moving both of the scanning stage and the first laser beam.

Embodiment Mode 2

With reference to FIGS. 3 to 5D, this embodiment mode describes an example of controlling the laser irradiation position by using an optical element and a photodetector. The optical element divides a laser beam into a plurality of beams and the photodetector detects the plurality of beams transmitted through the substrate. Throughout the drawings, the same reference numerals as those in FIGS. 1 and 2 are given to the same parts.

Figure 4:
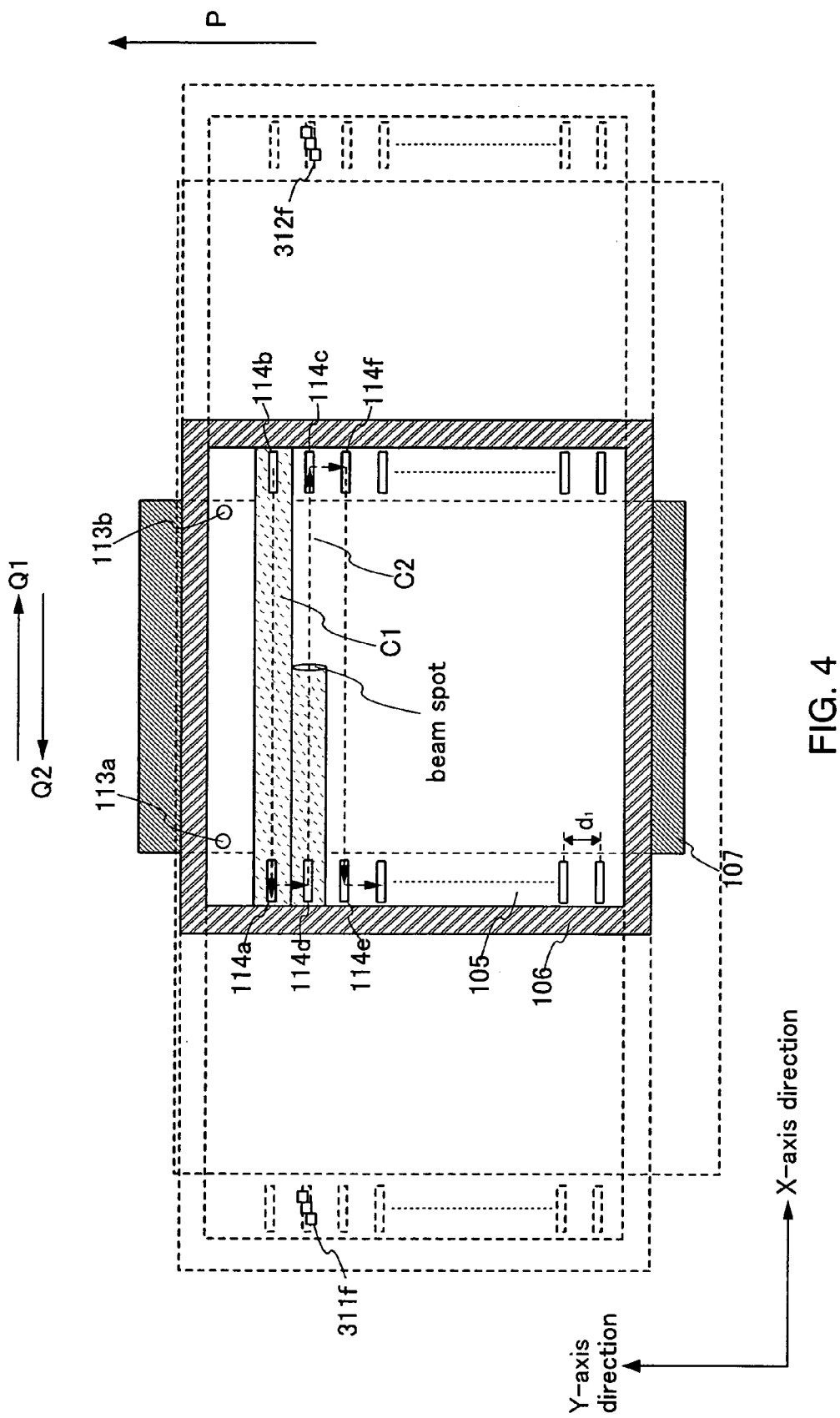
FIG. 4 is a drawing for showing a laser irradiation method of the present invention.

The glass substrate and the semiconductor film provided over the glass substrate are the same as those used in the embodiment mode 1. FIG. 4 is a top view of the glass substrate and the stage shown in FIG. 3. The glass substrate 106 is provided over the rotating stage 107, and the rotating stage 107 is provided over the X-axis stage 108 moving in the X-axis direction and the Y-axis stage 109 moving in the Y-axis direction. The rectangular markers 114 are formed over the substrate by patterning the semiconductor film 105 as described above.

For example, the rectangular marker 114 has a length of approximately 5 μm in the short-side direction and a length of approximately 1 mm in the long-side direction. In this case, when the annealing is performed by irradiating the semiconductor film with the first beam spot, a width of the large crystal grain region is 500 μm which is obtained by crystallization of a single laser irradiation. When the substrate moves back and forth from one end to the other end over the X-axis, the Y-axis stage 109 is slid by the width $d_1$ of the large crystal grain region (500 μm in this case). Thus, the whole surface of the substrate can be irradiated with the laser beam, and the large crystal grain can be formed all over the substrate. For this reason, in FIG. 4, each center-to-center distance between the markers 114a and 114d, 114d and 114e, 114b and 114c, and 114c and 114f is set to 500 μm. When the Y-axis stage 109 moves by 500 μm based on these markers, the whole surface of the substrate can be irradiated with the laser beam homogeneously.

In this embodiment mode, the width $d_1$ of the large crystal grain region is 500 μm, and accordingly the distance between the markers 114 is set to 500 μm. However, the present invention is not limited to this, and the center-to-center distance between the markers may be determined appropriately by a practitioner in consideration of the diameter of the laser beam spot and the width of the region to be crystallized.

When laser beams emitted from laser oscillators 311a and 312a are incident into these markers, three-array photodetectors 311f and 312f detect the laser beams. The laser beams emitted from the laser oscillators 311a and 312a are referred to as the second laser beams, and a beam spot of the second laser beam is referred to as a second beam spot.

The laser oscillators 311a and 312a emit the laser beams that are not absorbed in the glass substrate but that are absorbed in the semiconductor film. In this embodiment mode, the second laser beams emitted from the laser oscillators 311a and 312a are divided into three beams of a zeroth order beam traveling straightforward, a + first order diffraction beam, and a − first order diffraction beam by optical elements 311b and 312b respectively. Then, collimator lenses 311c and 312c suppress the divergence of the laser beams, and mirrors 311d and 312d change the traveling direction of the laser beams so as to be perpendicular to the glass substrate 106. For example, a diffraction grating is used as each of the optical elements 311b and 312b.

After that, the laser beams are converged on the glass substrate 106 by objective lenses 311e and 312e. The laser beams transmitted through the glass substrate 106 is detected by three-array photodetectors 311f and 312f. The system including the laser oscillator 311a, the optical element 311b, the collimator lens 311c, the mirror 311d, the objective lens 311e, and the three-array photodetector 311f is referred to as a laser positioning mechanism 311. In the same way, the system including the laser oscillator 312a, the optical element 312b, the collimator lens 312c, the mirror 312d, the objective lens 312e, and the three-array photodetector 312f is referred to as a laser positioning mechanism 312. It is noted that at least two laser positioning mechanisms are necessary at opposite ends of the X-axis stage 108 because the glass substrate 106 moves back and forth over the X-axis stage 108.

In this embodiment mode, each second beam spot over the glass substrate 106 has a diameter of 5 µm. The distance between the three beam spots is set to approximately 20 µm. As shown in FIGS. 4 to 5D, the beam spots are arranged so that they are oblique to the long side of the marker 114. Specifically, in this embodiment mode, the beam spots are adjusted so that when the zeroth order beam is in the center of the marker 114, the ± first order diffraction beams are on the edge of the marker 114. Here, the center-to-center distance p between the three beam spots over the glass substrate 106 can be expressed as the following equation.

$$p = l\alpha f_o / f_c$$

where d is the grating pitch of the optical element, 1 is the distance between the laser oscillator and the optical element, λ is the wavelength, $f_o$ is the focal length of the objective lens, and $f_c$ is the focal length of the collimator lens. α in this equation is expressed as the following equation.

$$\alpha = \pm \sin(\lambda/d) \approx \pm \lambda/d$$

The three-array photodetectors 311f and 312f are provided under the glass substrate 106 in accordance with the positions of the three beam spots. The positions of the three-array photodetectors 311f and 312f are adjusted so that the three beams are incident into the three-array photodetectors respectively.

Next, a method for controlling the irradiation position by using the three beam spots and the three-array photodetectors is described with reference to FIGS. 5A to 5D. In FIGS. 5A to 5D, the beam spots are illustrated with circles. A part of each circle that is illustrated with a dotted line is not detected by the photodetector because it is absorbed in the semiconductor film. A long rectangular marker 114 and square three-array photodetectors 311f are illustrated with a full line. The three-array photodetectors 311f include a photodetector 311fa, a photodetector 311fb, and a photodetector 311fc.

In this positioning method, the Y-axis stage 109 stops when the zeroth order beam in the center is detected by the photodetector 311fb and when the ± first order diffraction beams are detected by the photodetectors 311fa and 311fc with the same current value (FIG. 5B).

When the three beam spots are displaced to the left from the marker 114 (FIG. 5A), the current value detected by the photodetector 311fa is lower than that detected by the photodetector 311fc, and therefore the Y-axis stage 109 does not stop. When the three beam spots are displaced to the right from the marker 114 (FIG. 5C), the current value detected by the photodetector 311fa is higher than that detected the photodetector 311fc, and therefore the Y-axis stage 109 does not stop. When the three beam spots are out of the marker 114 (FIG. 5D), the current value detected by the photodetector 311fa is equal to that detected by the photodetector 311fc. However, the Y-axis stage 109 does not stop because the photodetector 311fb does not detect the current value.

With this method, the center position in the short-side direction of the marker 114 can be controlled accurately on the order of several µm. The diameter of each beam spot and the size of the marker 114 may be determined appropriately by a practitioner in accordance with the purpose.

Although the marker is rectangular in this embodiment mode, it may be elliptical or circular when the three beam spots satisfy the above-mentioned condition. Moreover, the shape of the second beam spot used to control the irradiation position is not limited to circular, and it may be elliptical or rectangular. However, a perfect circle is preferable to keep high positioning accuracy.

Since it is important that the first beam spot is scanned on the irradiation object in the Y-axis direction while keeping the uniform intervals, the irradiation position is correctly controlled using the marker in the long-side direction of the first beam spot, that is, the Y-axis direction. For this reason, the marker 114 is preferably made longer in the X-axis direction than in the Y-axis direction because the second laser beam is easily detected when the substrate moves in the Y-axis direction.

Next, the laser annealing is performed to the semiconductor film. When determining the laser irradiation starting position, the fixed CCD camera 110 and the two circular markers 113a and 113b can be used to correct the displacement of the substrate in the rotating direction. In the same way as the embodiment mode 1, the displacement of the substrate in the rotating direction can be corrected by adjusting the substrate with the use of the rotating stage 107 based on the obtained coordinates of the markers 113a and 113b.

The laser irradiation apparatus is set so that the second laser beam is incident into the marker 114a when the laser irradiation starting position is determined. When the laser irradiation is performed in the same way as the embodiment mode 1, the whole surface of the semiconductor film 105 formed over the glass substrate 106 can be annealed homogeneously. Moreover, although the Y-axis stage stops when more than the predetermined amount of current flows to the photodetector as described in the embodiment mode 1, more accurate position control is possible by using the three beam spots as described in this embodiment mode. Although this embodiment mode described the example of dividing the second laser beam into three, the number of divided beams is not limited to three, and the second laser beam may be divided into two beams or four or more beams.

Embodiment Mode 3

Figure 6:
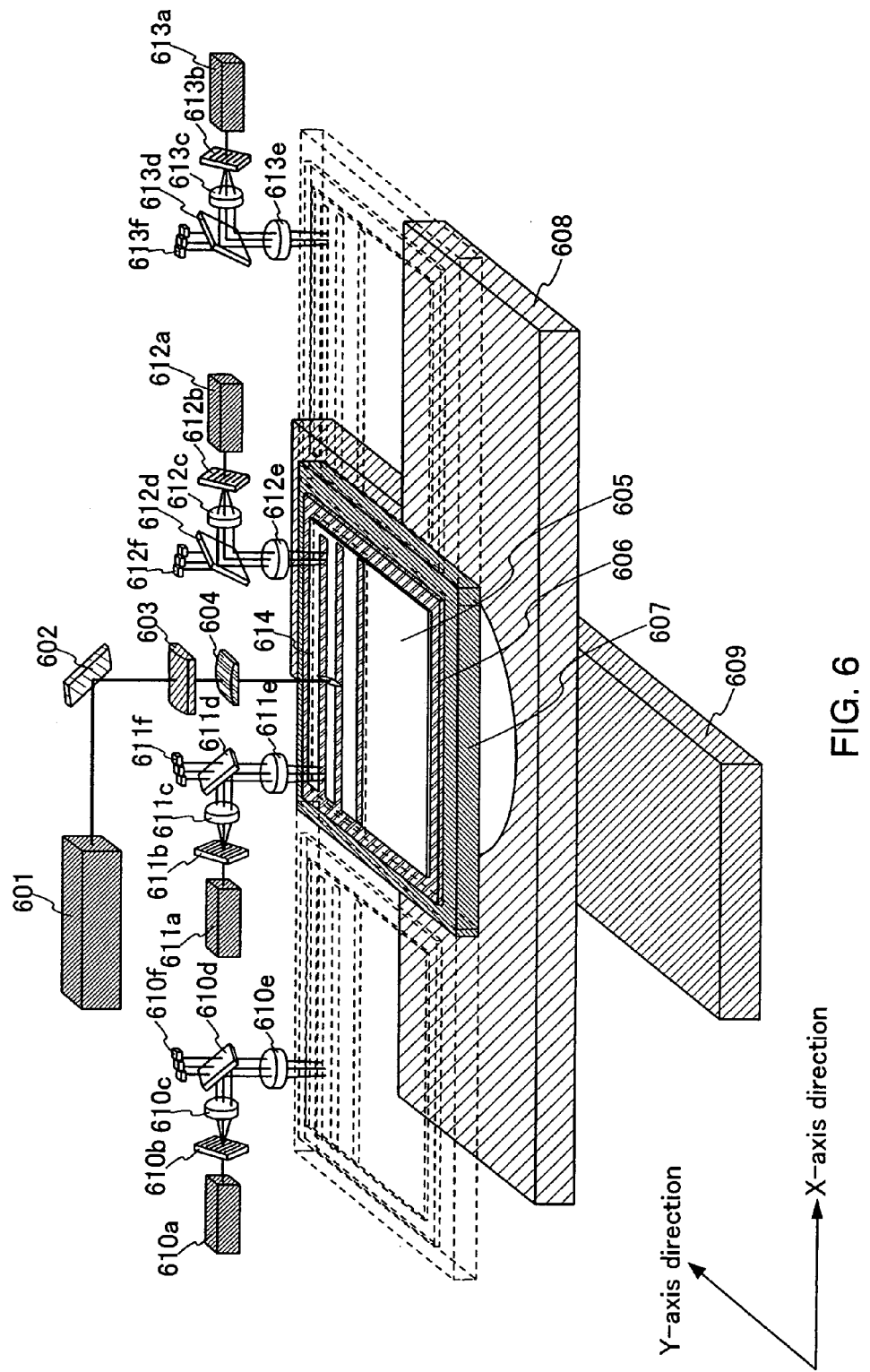
FIG. 6 is a drawing for showing a laser irradiation apparatus of the present invention.
Figure 7:
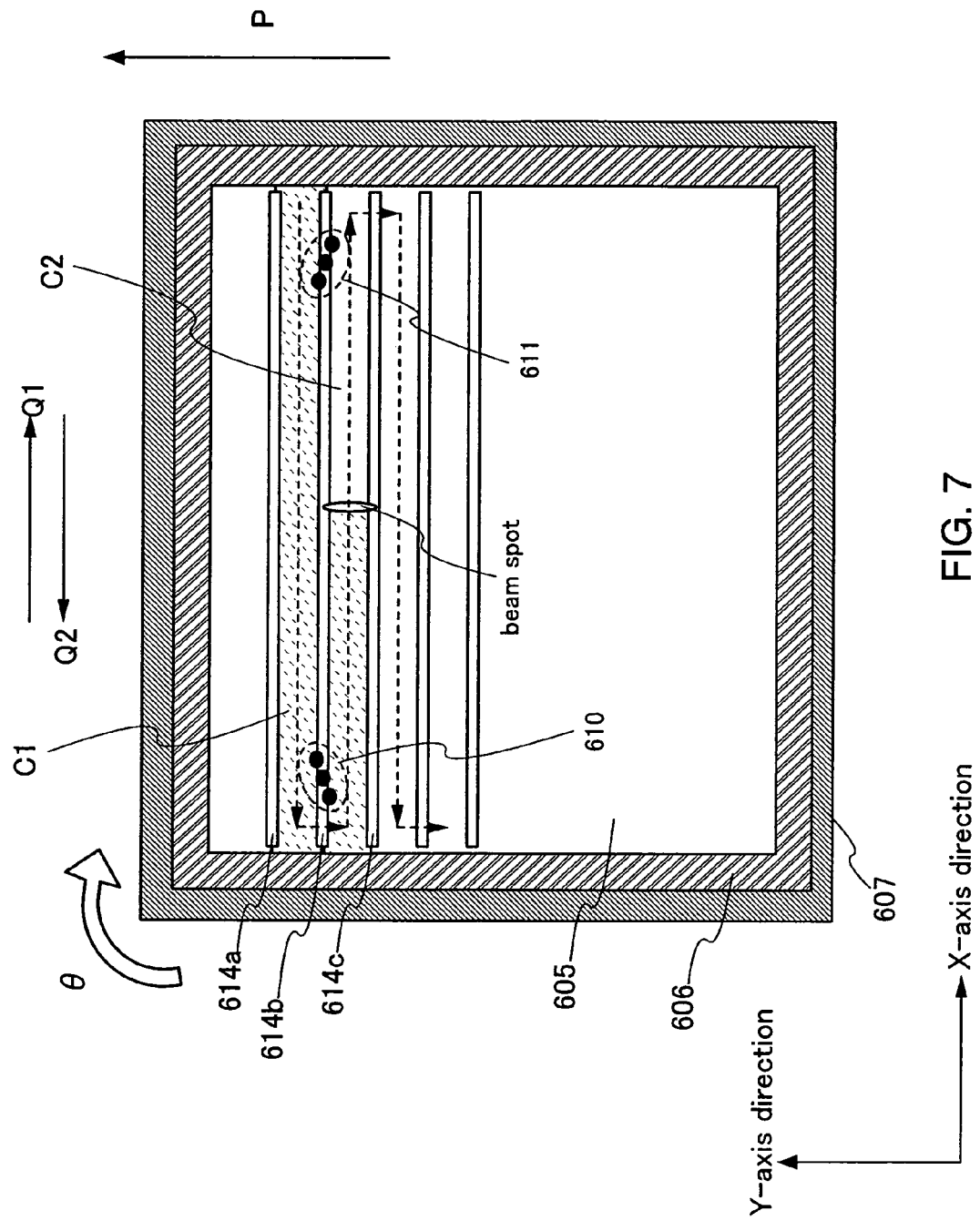
FIG. 7 is a drawing for showing a laser irradiation method of the present invention.

This embodiment mode describes an example of determining the laser irradiation position by a laser positioning mechanism with reference to FIGS. 6 and 7. This laser positioning mechanism uses a photodetector that detects a reflected beam from the substrate.

Unlike the embodiment modes 1 and 2 which use the CCD camera, this embodiment mode uses three laser beam spots and a marker which is long in the scanning direction of the laser beam (X-axis direction) to adjust the angle of the rotating axis. In the case of providing the photodetector under the glass substrate, there is a restriction on the space. Therefore, in this embodiment mode, the photodetector is provided above the substrate, and the intensity of the reflected light from the semiconductor film and the glass substrate is detected to determine the irradiation position.

In FIG. 6, a large glass substrate 606 with a semiconductor film 605 formed thereover is prepared. In this embodiment mode, after forming the semiconductor film 605 all over the glass substrate 606, a marker 614 extending long in the scanning direction of the laser beam is formed by mask patterning or high-power laser irradiation. In this embodiment mode, the same number of markers as the scanning times of the laser beam are provided by removing the semiconductor film according to the mask patterning.

When the semiconductor film 605 formed over the substrate 606 is irradiated with the laser beam, the intensity of the reflected beam is different at the marker 614 and the semiconductor film because the semiconductor film is removed in the marker 614. For example, in the case of irradiating an amorphous semiconductor film formed in 55 nm thick over the glass substrate 606 with the laser beam having the wavelength of 632 nm, the reflectance of the amorphous semiconductor film is approximately 65%, and the reflectance of the glass substrate is approximately 10%.

Then, three-array photodetectors 610f to 613f detect the reflected laser beam by converting it into electricity. When the current value satisfies the predetermined condition, the Y-axis stage 609 stops. When the current value does not satisfy the predetermined condition, the Y-axis stage 609 does not stop. Moreover, the displacement of the substrate in the rotating direction is corrected by detecting the reflected three laser beams in two different points on the substrate with the use of the two laser positioning mechanisms at the same time. By using these, the irradiation position of the beam spot is determined correctly.

A laser beam emitted from a laser oscillator 601 is reflected by a mirror 602 so that the traveling direction of the laser beam is changed to be perpendicular to the semiconductor film 605 formed over the glass substrate 606. Then, the incident laser beam is converged in two directions by two cylindrical lenses 603 and 604 respectively and is shaped into linear on the semiconductor film 605. The laser beam emitted from the laser oscillator 601 is referred to as a first laser beam, and a beam spot of the first laser beam is referred to as a first beam spot. Although the first beam spot is shaped into linear in this embodiment mode, it may be elliptical or rectangular with large aspect ratio. The annealing can be performed effectively by moving the glass substrate 606 relatively in the short-side direction of the first beam spot.

FIG. 7 is a top view of the glass substrate and the stage in the laser irradiation apparatus shown in FIG. 6. The same reference numeral is given to the same part in both figures. The glass substrate 606 is mounted over the rotating stage 607, and the rotating stage 607 is mounted over an X-axis stage 608 moving in the X-axis direction and a Y-axis stage 609 moving in the Y-axis direction. The glass substrate 606 has the rectangular marker 614 thereover as described above by patterning the semiconductor film 605. Although the marker 614 is rectangular in this embodiment mode, its shape may be determined appropriately by a practitioner in consideration of the spot size of the laser beam.

The center-to-center distance between the markers 614a and 614b and between 614b and 614c may be determined by the practitioner appropriately. However, since the Y-axis stage 609 moves based on these markers, the center-to-center distance is preferably $d_1$, which is the width of the large crystal grain region formed in the semiconductor film by the first beam spot.

Laser beams emitted from laser oscillators 610a to 613a are incident into these markers. The laser beams emitted from the laser oscillators 610a to 613a are referred to as second laser beams, and a beam spot of the second laser beam is referred to as a second beam spot. At least four laser positioning mechanisms are used in order to correct the displacement of the glass substrate 606 in the rotating direction constantly when the glass substrate 606 moves back and forth by the X-axis stage 608. For example, the four laser positioning mechanisms are arranged so that the two mechanisms among them can be positioned over the glass substrate at a certain instant.

The laser oscillators 610a to 613a emit laser beams that are not sufficiently reflected on the glass substrate but that are sufficiently reflected on the semiconductor film. In this embodiment mode, a red laser with an output power of 1 mW or less, such as a HeNe laser, is used as the laser oscillators 610a to 613a. The second laser beam is divided into three beams of a zeroth order beam traveling straightforward, a + first order diffraction beam, and a − first order diffraction beam. Then, collimator lenses 610c to 613c suppress the divergence of the laser beams, and half mirrors 610d to 613d change the traveling direction of the laser beam so as to be perpendicular to the glass substrate 606.

After that, the laser beams are converged on the glass substrate 606 by optical elements 610e to 613e. Here, the system including the laser oscillator 610a, the optical element 610b, the collimator lens 610c, the half mirror 610d, the optical element 610e, and the three-array photodetector 610f is referred to as a laser positioning mechanism 610. In the same way, the system including the parts denoted with the reference numerals 611a to 611f is referred to as a laser positioning mechanism 611, the system including the parts denoted with the reference numerals 612a to 612f is referred to as a laser positioning mechanism 612, and the system including the parts denoted with the reference numerals 613a to 613f is referred to as a laser positioning mechanism 613.

Here, each second beam spot on the glass substrate 606 has a diameter of 5 μm. The center-to-center distance between the three beam spots is set to approximately 20 μm, and they are arranged so that they are oblique to the long-side direction of the marker 614 as shown in FIGS. 6 and 7. Moreover, they are adjusted so that when the zeroth order beam is in the center of the marker 614, the ± first order diffraction beams always are on the edge of the marker 614. The center-to-enter distance p between the three beam spots is expressed as the following equation:

$$p = l\alpha f_0/f_c$$

where d is the grating pitch of the optical element, l is the distance between the laser oscillator and the optical element, λ is the wavelength of the laser beam, $f_0$ is the focal length of the objective lens, and $f_c$ is the focal length of the collimator lens. α in the above equation is expressed as the following equation:

$$\alpha = \pm\sin(\lambda/d) \approx \pm\lambda/d$$

The three-array photodetectors 610f to 613f are arranged just above the half mirrors 610d to 613d respectively in accordance with the positions of the three beam spots. The three-array photodetectors 610f to 613f are arranged so that the three beam spots are incident into the three-array photodetectors respectively. The detection method using the three beam spots and the three-array photodetector may be referred to the embodiment mode 2 (FIG. 5).

Among four three-array photodetectors 610f to 613f provided above the glass substrate to correct the displacement of the substrate in the rotating direction, two three-array photodetectors are used at the same time. To correct the displacement of the substrate in the rotating direction, the substrate may be repeatedly rotated or moved in the Y-axis direction until the two photodetectors simultaneously satisfy the state of FIG. 5B. For example, in FIG. 7, the Y-axis stage moves in a P-direction. When one of the three-array photodetectors 610f and 611f satisfies the state of FIG. 5B first, the stage is rotated in a θ direction in FIG. 7 until the other one of three-array photodetectors satisfies the state of FIG. 5B. When the rotated angle of the stage is $\theta_1$ ($0 < \theta_1 < \Pi/2$) and the distance between the three-array photodetectors 610f and 611f is 1, the substrate is rotated by $\theta_1/2$ in the opposite direction from the position where the latter photodetector satisfying the state of FIG. 5B, and the Y-stage is moved by $1\theta_1/4$ in the P-direction. Accordingly, the displacement of the substrate in the rotating direction can be corrected.

The laser irradiation apparatus is set so that the second laser beam is incident into the marker 614a when the laser irradiation starting position is determined. Since the semiconductor film is removed at the marker 614, the laser beam reflected on the marker 614 has low intensity. The reflected laser beam is detected by the three-array photodetector 610f provided just above the half mirror, and the Y-axis stage 609 stops when the current value satisfying the particular condition is detected.

On the other hand, the first beam spot is scanned on the part C1 by the X-axis stage 608 in the Q1 direction shown in FIG. 7. After that, the Y-axis stage 609 is slid in the long-side direction of the first beam spot, which means the P direction in FIG. 7. The second laser beam reflected at the marker 614b is detected by the photodetector 613f. When the detected current value satisfies the particular condition, the Y-axis stage 609 stops.

Subsequently, the part C2 of the semiconductor film 605 is irradiated in a Q2 direction by the X-axis stage 608. After that, the Y-axis stage 609 is moved in the P direction in the same way. When the second laser beam is incident into the next marker 614c and the current value satisfying the particular condition is detected by the three-array photodetector 610f, the Y-axis stage 609 stops. Next, the X-axis stage is moved in a Q1 direction.

By repeating this operation, the whole surface of the semiconductor film 605 formed over the large glass substrate 606 can be irradiated with the laser beam. It is preferable to move the stage by detecting the laser beam with the use of the photodetector because accurate positioning can be performed in short time compared with the case of the image processing by a CCD camera. In this embodiment mode, the substrate is not displaced because the laser positioning mechanism works with the stage.

Although the embodiment modes 1 to 3 showed the examples of irradiating the irradiation object with the laser beam by moving the scanning stage with the substrate mounted, the present invention is not limited to this. For example, the annealing may be performed by moving the laser beam while fixing the irradiate object, or both of the laser beam and the irradiation object may be moved.

Embodiment 1

Figure 8:
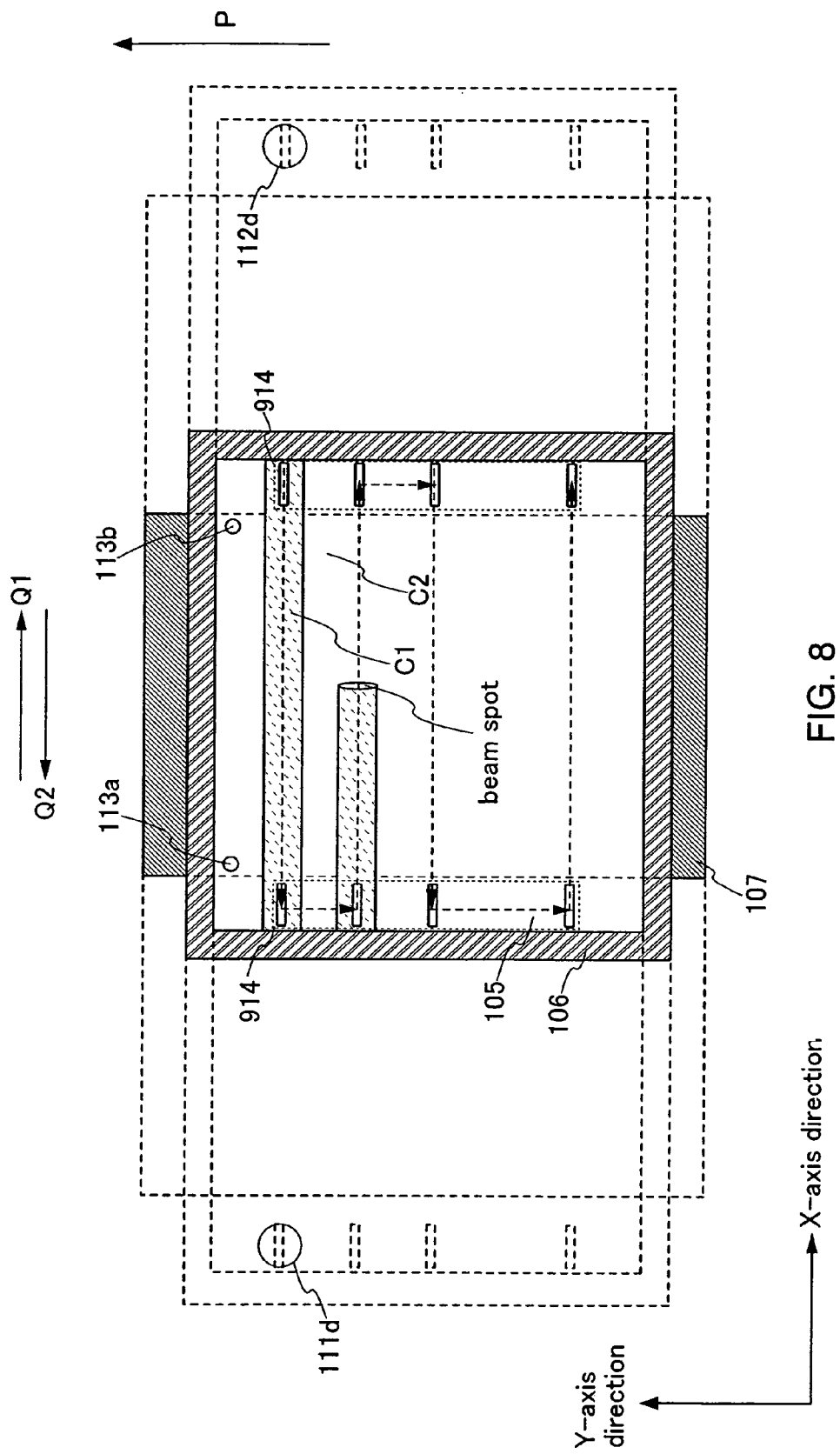
FIG. 8 is a drawing for showing a laser irradiation method of the present invention.

With reference to FIG. 8, this embodiment describes an example of selectively forming the markers for controlling the laser irradiation position so as to anneal only the region to be crystallized. The same reference numerals as those in the embodiment modes are given to the same parts.

In the embodiment modes 1 to 3, the laser irradiation is performed to anneal the whole surface of the substrate over which the markers to control the irradiation position in the Y-axis direction are provided at uniform intervals. On the other hand, in this embodiment mode, the markers to control the irradiation position in the Y-axis direction are formed selectively so that only the region to be crystallized is irradiated with the laser beam selectively.

In FIG. 8, markers 914 are formed at opposite ends of the substrate selectively differently from the embodiment modes in which the markers are formed at uniform intervals. The irradiation position in the Y-axis direction is determined by the markers 914, and the laser beam is scanned in the X-axis direction or the long-side direction of the markers 914. In other words, any region can be irradiated with the laser beam by selectively forming the marker 914 in the position to be crystallized.

Since the region to be crystallized is a part of the semiconductor film that is left over the substrate after the mask patterning, it is possible to know the region in advance from the mask. The laser irradiation region is determined so as to crystallize at least the part of the semiconductor film obtained by the mask patterning, and the markers 914 are formed so that the laser beam spot is scanned on the laser irradiation region. Then, the semiconductor film is partially crystallized. In other words, in this embodiment, not the whole surface of the semiconductor film is irradiated with the laser beam, but only the necessary part thereof is irradiated with the laser beam so as to be crystallized.

By performing the laser irradiation selectively not in the whole surface but only in the region to be crystallized, the efficiency of the annealing is enhanced. When the markers are formed thus only in the position where the annealing is performed, the irradiation position can be controlled accurately.

Although FIG. 8 showed the example of the laser positioning mechanism that determines the irradiation position by detecting the transmitted laser beam, the laser positioning mechanism may determine the irradiation position by detecting the reflected laser beam as described in the embodiment mode 3 (FIG. 7). In other words, the markers 614 may be formed selectively in FIG. 7, and the laser irradiation may be performed only to the region to be crystallized so as to increase the processing speed of the annealing.

Figure 10A:
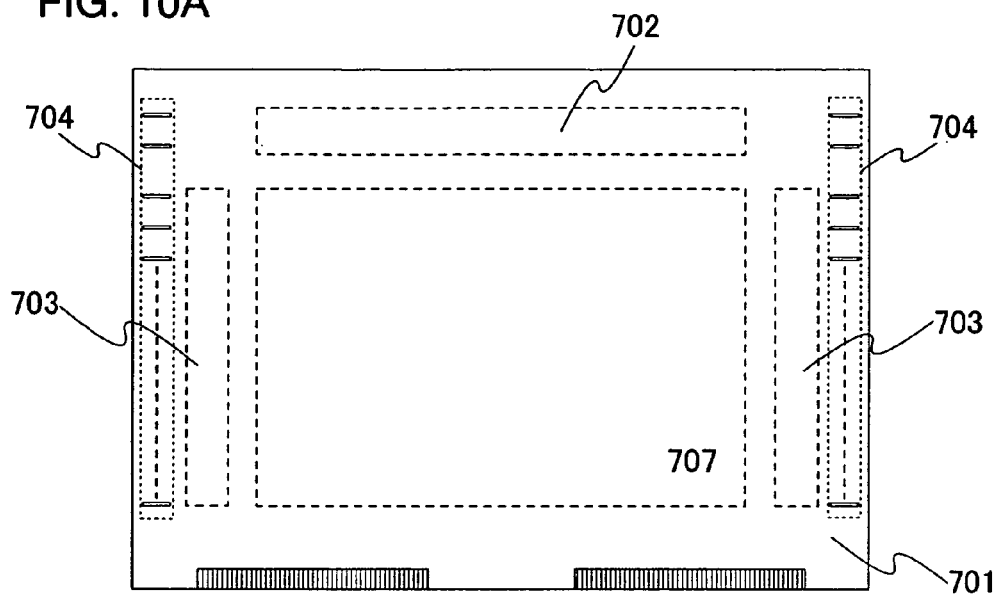
FIGS. 10A and 10B are drawings for showing a method for irradiating a substrate partially.
Figure 10B:
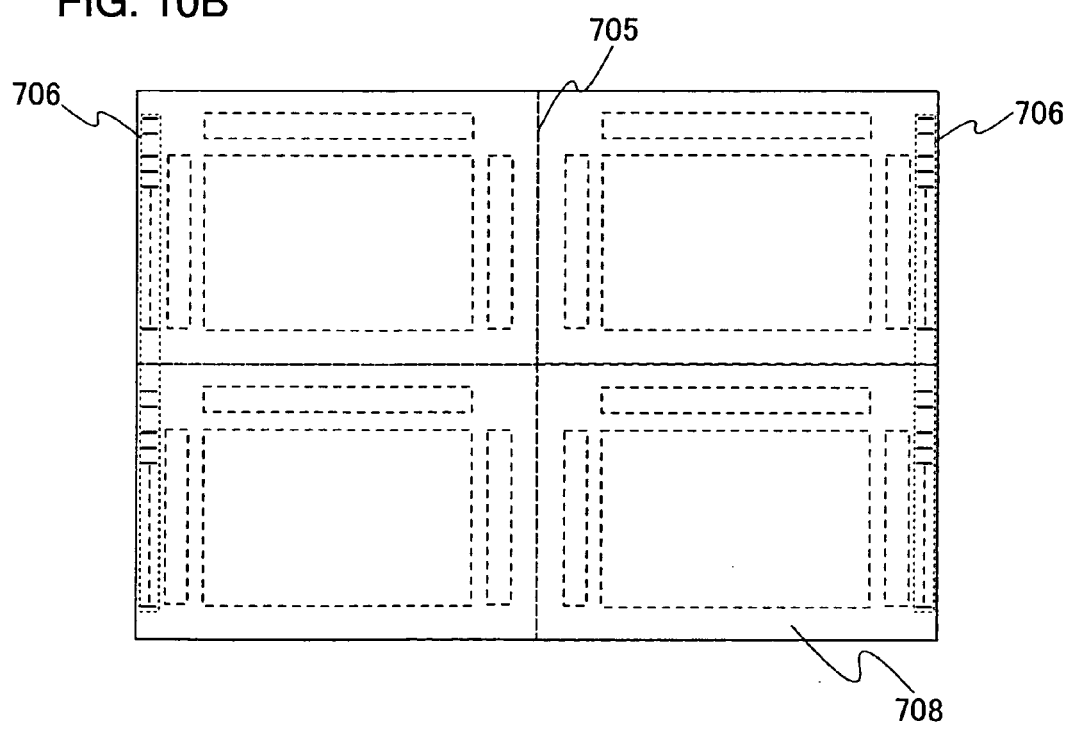

The specific example of selective laser irradiation is shown in FIGS. 10A and 10B. FIG. 10A shows the example of manufacturing a semiconductor device over a substrate, while FIG. 10B shows the example of manufacturing four semiconductor devices over a substrate. In FIG. 10A, a semiconductor film 701 is formed over the substrate. In both figures, a pixel portion 707, a signal line driver circuit 702, and a scanning line driver circuit 703 are illustrated with a dotted line. A region where a plurality of markers are formed, which is referred to as a marker formation portion 704, is provided at the opposite ends of the substrate.

In this case, only the necessary region is irradiated with the laser beam by forming the marker formation portion 704 only in the region to be crystallized. In FIGS. 10A and 10B, the laser irradiation is performed only to the regions where the pixel portion 707, the signal line driver circuit 702, and the scanning line driver circuit 703 are formed. This can increase the processing speed. Moreover, in the pixel portion 707, the laser irradiation can be performed selectively not to the whole surface but to only the part of the semiconductor film that is left over the substrate after the patterning.

In FIG. 10B, a semiconductor film 708 is formed over the substrate. A marker formation portion 706 is provided at the opposite ends of the substrate. In this case, four semiconductor devices are manufactured by dividing the substrate along a scribe line 705 in the later step.

The marker formation portion 706 includes a plurality of markers and is provided at the opposite ends of the substrate. In the same way as FIG. 10A, the annealing can be performed with minimum laser irradiation by providing the marker formation portion 706 only to the region to be crystallized (the part of the semiconductor film where the pixel portion, the signal line driver circuit, and the scanning line driver circuit are formed). With the laser positioning mechanism of the present invention, the laser irradiation can be performed while determining the irradiation position correctly in the large substrate. Accordingly, a plurality of semiconductor devices can be manufactured from one substrate simultaneously, and mass production can be performed more effectively.

This embodiment can be freely combined with any one of the embodiment modes 1 to 3.

Embodiment 2

Figure 15:
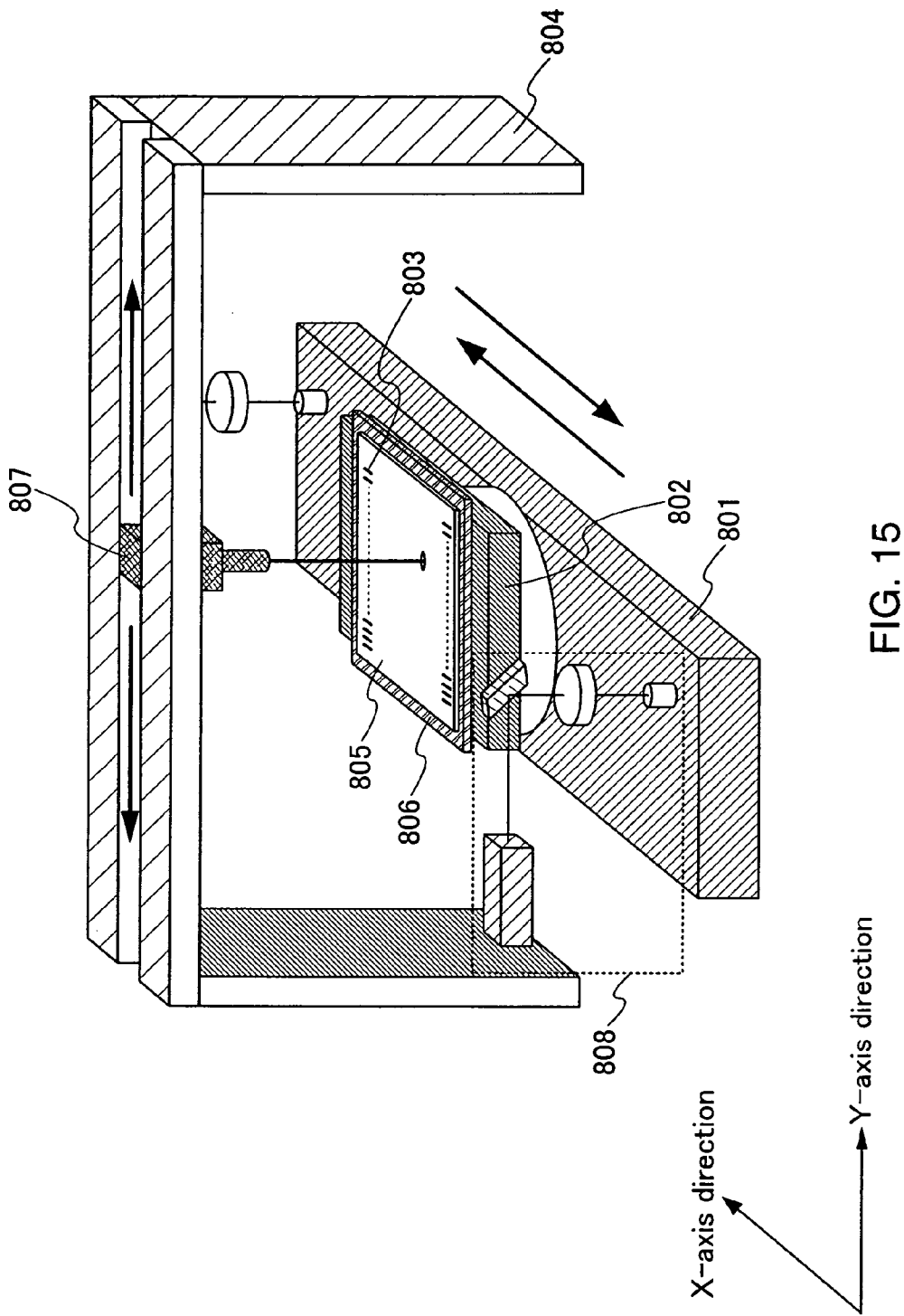
FIG. 15 is a drawing for showing a laser irradiation method of the present invention.

In the embodiment modes, the laser irradiation is performed to the irradiation object while fixing the laser beam and moving the scanning stage with the irradiation object mounted. With reference to FIG. 15, this embodiment describes an example of the laser annealing by moving both of the laser beam and the scanning stage with the irradiation object mounted.

In FIG. 15, in the same way as FIG. 1, a glass substrate 806 with a semiconductor film 805 formed thereover is prepared. The glass substrate 806 is provided over a rotating stage 802, and the rotating stage 802 is provided over a first scanning stage 801 moving in one direction, that is, an X-axis direction. A rectangular marker 803 is formed over the substrate 806 by patterning the semiconductor film in the same way as the embodiment modes.

A second scanning stage 804 is provided in this embodiment, and a laser irradiation apparatus 807 moving in a Y-axis direction is provided to the second scanning stage 804. The laser irradiation apparatus 807 may be the same as that used in the embodiment modes. The laser irradiation apparatus 807 may include a semiconductor laser. Since the semiconductor laser is compact, it has an advantage that the laser irradiation apparatus can be easily moved.

In FIG. 15, the laser irradiation is performed to anneal the semiconductor film. Specifically, the semiconductor film is irradiated with the laser beam while moving the glass substrate 806 in the short-side direction of the beam spot (X-axis direction). When the laser irradiation apparatus 807 moves in the long-side direction of the beam spot (Y-axis direction), the laser irradiation apparatus 807 moves accurately in order to determine the laser irradiation position.

Specifically, after the laser irradiation is performed from one end of the glass substrate 806 to the other end thereof by moving the glass substrate 806 in the X-axis direction, the laser irradiation apparatus 807 provided to the second scanning stage 804 is moved in the Y-axis direction. The moving distance in the Y-axis direction can be controlled by selectively providing the markers. After that, the laser irradiation is performed while moving the glass substrate 806 in the direction opposite to the X-axis direction from one end of the glass substrate 806 to the other end thereof. Subsequently, the laser irradiation apparatus 807 is moved in the Y-axis direction. By repeating this operation, the whole surface of the substrate can be irradiated with the laser beam.

In this case, the laser irradiation position is determined by a laser positioning mechanism 808 provided at opposite ends of the first scanning stage 801 by the same method as the embodiment mode. The laser positioning mechanism 808 works with the laser irradiation apparatus 807 and controls the movement of the laser irradiation apparatus 807. Moreover, the laser irradiation apparatus 807 may be used both as the laser for crystallizing the semiconductor film and the laser for controlling the irradiation position in the Y-axis direction. Furthermore, another laser for determining the irradiation position may be mounted in adjacent to the laser irradiation apparatus 807.

In this embodiment, like the embodiment modes, the stage moves slowly in Y-axis direction and fast in the X-axis direction. Although the laser irradiation apparatus 807 moves slowly in the Y-axis direction and the glass substrate 806 moves fast in the X-axis direction in FIG. 15, they may be opposite. Moreover, the laser annealing may be performed while moving the laser irradiation apparatus 807 in both X-axis direction and Y-axis direction instead of moving the glass substrate 806.

This embodiment can be freely combined with any one of the embodiment modes 1 to 3 and the embodiment 1.

Embodiment 3

This embodiment describes an example of a method for manufacturing a semiconductor device of the present invention. Although this embodiment describes a light-emitting device as the example of the semiconductor device, the semiconductor device that can be manufactured by the present invention is not limited to this, and a liquid crystal display device or other semiconductor devices may be manufactured.

The light-emitting device is a semiconductor device having a light-emitting element and a current supplying unit for supplying current to the light-emitting element in each of a plurality of pixels. The light-emitting element typified by an OLED (organic light-emitting diode) has an anode layer, a cathode layer, and a layer (electroluminescent layer) including an electroluminescent material that gives luminescence by applying an electric field thereto. The electroluminescent layer is a single layer or multilayers formed between the anode layer and the cathode layer. The electroluminescent layer may include an inorganic compound.

Figure 11A:
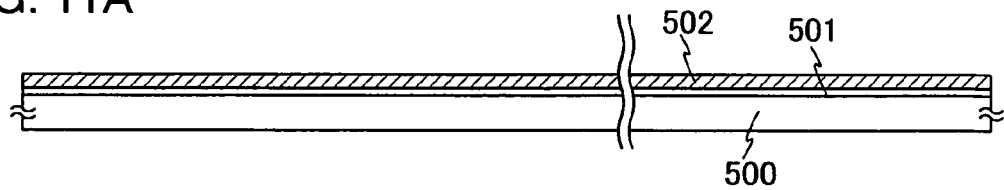
FIGS. 11A to 11E are drawings of processes for manufacturing a semiconductor device with the use of the laser irradiation method of the present invention.

First, a substrate 500 over which a TFT (thin film transistor) will be formed is prepared as shown in FIG. 11A. The substrate 500 may be, for example, a substrate made from barium borosilicate glass or aluminoborosilicate glass. Moreover, a quartz substrate or a ceramic substrate may be used. Furthermore, a metal substrate or a semiconductor substrate with an insulating film formed thereover may be used. Although a flexible substrate made from synthetic resin such as plastic is generally inferior to the above substrates in the heat resistance, the flexible substrate can be used when it can resist the processing temperature in the manufacturing steps. A surface of the substrate 500 may be polished by a CMP method or the like so as to be planarized.

Next, a base film 501 including an insulating material such as silicon oxide, silicon nitride, silicon oxynitride, or the like may be formed over the substrate 500 by a known method (a sputtering method, an LPCVD method, a plasma CVD method, or the like). Although the base film 501 is a single insulating film in this embodiment, the base film 501 may include two or more insulating layers.

Next, an amorphous semiconductor film 502 is formed in 50 nm thick over the base film 501 by the plasma CVD method. Then, a dehydrogenation process is performed. Although the condition of the dehydrogenation process depends on the hydrogen content in the amorphous semiconductor film, it is preferable that the amorphous semiconductor film is dehydrogenated at temperatures from 400 to 550° C. for several hours. The following crystallization process is desirably performed after the hydrogen content in the amorphous semiconductor film decreases to 5 atoms % or less by the dehydrogenation process. The amorphous semiconductor film may be formed by another method such as the sputtering method or the evaporation method. In any method, it is preferable to decrease the impurity element in the amorphous semiconductor film such as oxygen or nitrogen sufficiently.

Not only silicon but also silicon germanium can be used as the semiconductor. When the silicon germanium is used, the density of the germanium may range from approximately 0.01 to 4.5 atomic %.

In this embodiment, both of the base film 501 and the amorphous semiconductor film 502 are formed by the plasma CVD method. The base film 501 and the amorphous semiconductor film 502 may be formed continuously in vacuum. By forming the base film 501 and the amorphous semiconductor film 502 continuously without exposing them to the air, it is possible to prevent the interface therebetween from being contaminated and to reduce the variation of the characteristic of the TFTs to be manufactured.

Figure 11B:
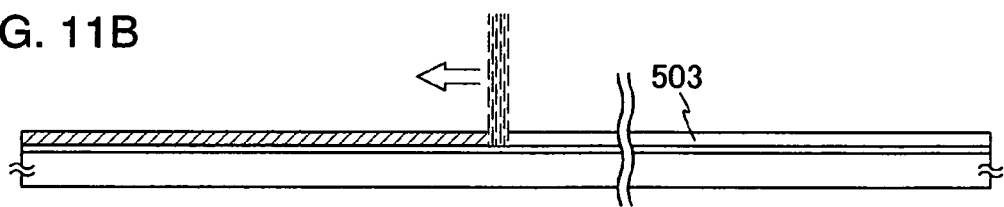

Next, the amorphous semiconductor film 502 is crystallized by a laser crystallization method as shown in FIG. 11B. The laser irradiation apparatus of the present invention is used in the laser crystallization method. The laser crystallization method may be performed in combination with another known crystallization method such as a thermal crystallization method using RTA or an annealing furnace or a thermal crystallization method using a metal element for promoting the crystallization.

When the amorphous semiconductor film is crystallized by a continuous wave solid-state laser with the second, third, or fourth harmonic of the fundamental wave, a large crystal grain can be obtained. Typically, it is desirable to use the second (532 nm) or third harmonic (355 nm) of a Nd:YVO$_4$ laser (fundamental wave 1064 nm). Specifically, the laser beam emitted from the continuous wave YVO$_4$ laser is converted into the harmonic with an output power of 10 W by a non-linear optical element. The non-linear optical element may be set in the resonator with the YVO$_4$ crystal in order to emit the harmonic. Then, the processing object is irradiated with the laser beam that is preferably shaped into rectangular or elliptical on the irradiation surface by the optical system. The energy density needs to be in the range of approximately 0.01 to 100 MW/cm$^2$ (preferably 0.1 to 10 MW/cm$^2$). The laser irradiation is performed while moving the substrate 500 relative to the laser beam at the scanning speed from approximately 10 to 2000 cm/s.

The laser irradiation can be performed using a continuous wave gas or solid-state laser. The gas laser is, for example, an Ar laser or a Kr laser. The solid-state laser is, for example, a YAG laser, a YVO$_4$ laser, a GdVO$_4$ laser, a YLF laser, a YAlO$_3$ laser, an alexandrite laser, a Ti: Sapphire laser, or a Y$_2$O$_3$ laser. As the solid-state laser, a laser using a crystal such as YAG, YVO$_4$, YLF, YAlO$_3$, GdVO$_4$, or the like each of which is doped with Cr, Nd, Er, Ho, Ce, Co, Ti, Yb, or Tm can be also used. Although the fundamental wavelengths of these lasers depend on the doped element, they are approximately 1 μm. The harmonic of the fundamental wave can be obtained by using the non-linear optical element.

A crystalline semiconductor film 503 having its crystallinity enhanced is formed by performing the laser crystallization in such a way that a marker is formed to the region to be crystallized in the amorphous semiconductor film and the laser irradiation is performed selectively.

Figure 11C:
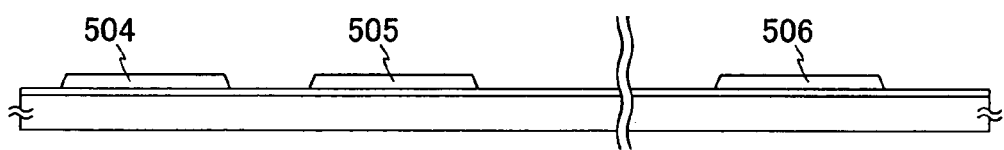
Figure 11D:
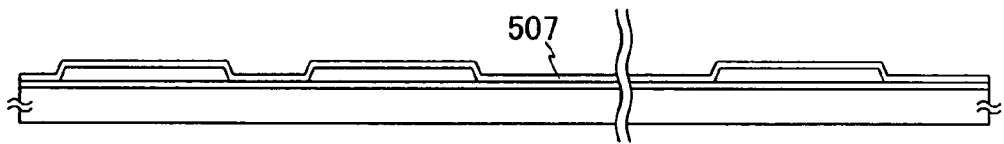

Next, the crystalline semiconductor film 503 is patterned into a desired shape to form island-shaped semiconductor films 504 to 506 which become active layers of TFTs (FIG. 11C). To control the threshold value of the TFT, a small amount of impurity elements (boron or phosphorous) may be doped after forming the island-shaped semiconductor films 504 to 506.

Next, a gate insulating film 507 mainly including silicon oxide or silicon nitride is formed so as to cover the island-shaped semiconductor films 504 to 506. In this embodiment, a silicon oxide film is formed by the plasma CVD method under the condition where TEOS (tetraethyl orthosilicate) is mixed with O$_2$, the reaction pressure is 40 Pa, the substrate temperature ranges from 300 to 400° C., and the electricity is discharged with high frequency (13.56 MHz) at electric density from 0.5 to 0.8 W/cm$^2$. The silicon oxide film manufactured thus obtains good characteristic as the gate insulating film by performing the thermal annealing at 400 to 500° C. thereafter. The gate insulating film may be formed of aluminum nitride. The aluminum nitride is relatively high in heat conductivity, thereby being able to diffuse the heat generated in the TFT effectively. The gate insulating film may be multilayers in which aluminum nitride is formed over silicon oxide or silicon oxynitride not including aluminum.

Figure 11E:
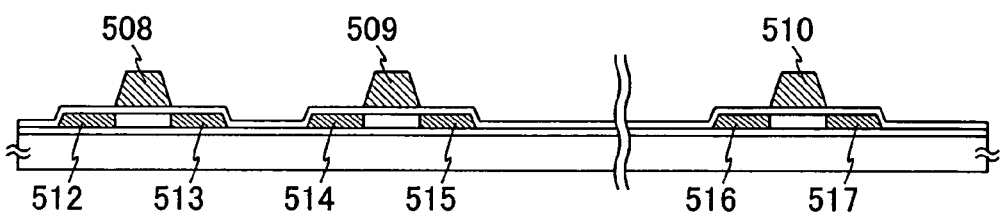

Then, as shown in FIG. 11E, a conductive film is formed in 100 to 500 nm thick over the gate insulating film 507 and patterned to form gate electrodes 508 to 510.

In this embodiment, the gate electrode may be formed of an element selected from the group consisting of Ta, W, Ti, Mo, Al, and Cu. Moreover, the gate electrode may be formed of an alloy material or a compound material mainly including any one of the above elements. Furthermore, the gate electrode may be formed of the semiconductor film typified by a poly-crystalline silicon film with the impurity element such as phosphorous doped. The gate electrode may include a single conductive film or plural conductive films.

When the gate electrode is formed of two conductive films, preferable combinations are tantalum nitride (TaN) as the first conductive film and tungsten (W) as the second conductive film, tantalum nitride (TaN) as the first conductive film and Al as the second conductive film, and tantalum nitride (TaN) as the first conductive film and Cu as the second conductive film. Moreover, the first and second conductive films may be a semiconductor film typified by a poly-crystalline silicon film doped with the impurity element such as phosphorous or may be formed of AgPdCu alloy.

The structure of the gate electrode is not limited to the two-layer structure, and it may be a three-layer structure in which, for example, a tungsten film, an aluminum-silicon alloy (Al—Si) film, and a titanium nitride film are laminated sequentially. An aluminum-titanium alloy (Al—Ti) film may be used instead of the aluminum-silicon alloy (Al—Si) film, and a titanium film may be used instead of the titanium nitride film. It is important to select the optimum etching method and the optimum kind of etchant in accordance with the material of the conductive film.

Next, n-type impurity regions 512 to 517 are formed by adding an n-type impurity element. In this embodiment, an ion doping method using phosphin (PH$_3$) is employed.

Figure 12A:
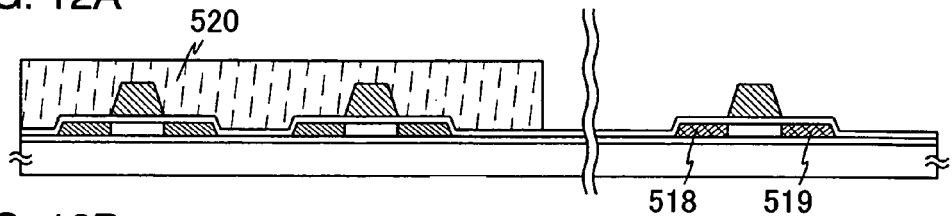
FIGS. 12A to 12E are drawings of processes for manufacturing a semiconductor device with the use of the laser irradiation method of the present invention.

Next, as shown in FIG. 12A, p-type impurity regions 518 and 519 are formed by adding a p-type impurity element to a region where a p-channel TFT is formed while covering the region where an n-channel TFT is formed with a resist mask 520. In this embodiment, an ion doping method using diborane (B$_2$H$_6$) is employed.

Then, the doped impurity elements in the respective island-shaped semiconductor layers are activated for the purpose of controlling the electrical conductivity type. This activation process is performed by a thermal annealing method using the annealing furnace. Besides, the laser annealing method and the rapid thermal annealing (RTA) method can be applied. The thermal annealing is performed with the oxygen density of 1 ppm or less, preferably 0.1 ppm or less, in the nitrogenous atmosphere of 400 to 700° C., typically 500 to 600° C. In this embodiment, the heat treatment is performed at 500° C. for four hours. However, when the gate electrodes 508 to 510 are sensitive to heat, it is preferable to perform the activation process after forming the interlayer insulating film (mainly including silicon) in order to protect the wiring or the like.

In the case of the laser annealing, the lasers used in the crystallization can be used. In the activation process, the scanning speed of the laser beam is the same as that in the crystallization, and the energy density is necessary in the range of approximately 0.01 to 100 MW/cm$^2$ (preferably 0.01 to 10 MW/cm$^2$). The continuous wave laser may be used in the crystallization, and the pulsed laser may be used in the activation.

Next, heat treatment is performed at 300 to 450° C. for 1 to 12 hours in the atmosphere including hydrogen by 3 to 100% to hydrogenate the island-shaped semiconductor layer. This is to terminate the dangling bond in the semiconductor layer by the hydrogen excited thermally. As another means of hydrogenation, plasma hydrogenation may be performed (using hydrogen excited in plasma).

Figure 12B:
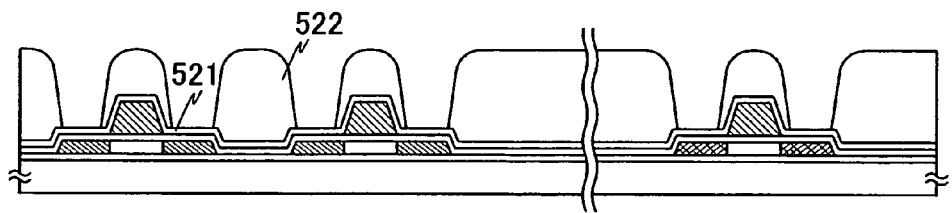

Next, as shown in FIG. 12B, a first inorganic insulating film 521 is formed of silicon oxynitride in 10 to 200 nm thick by a CVD method. The material of the first inorganic insulating film is not limited to silicon oxynitride, and it may be an inorganic insulating film including nitrogen that can suppress the access of the moisture to an organic resin film to be formed afterward. For example, silicon nitride, aluminum nitride, or aluminum oxynitride can be used. It is noted that aluminum nitride is relatively high in heat conductivity, thereby being able to diffuse the heat generated in the TFT or the light-emitting element effectively.

An organic resin film 522 is formed of a positive photosensitive organic resin over the first inorganic insulating film 521. Although the organic resin film 522 is formed of the positive photosensitive acrylic in this embodiment, the present invention is not limited to this.

In this embodiment, the organic resin film 522 is formed by applying positive photosensitive acrylic by a spin coating method and baking it thereafter. The thickness of the organic resin film 522 is set in the range of 0.7 to 5 μm (preferably 2 to 4 μm) after the baking.

Next, a part of the organic resin film 522 where an opening portion is formed is exposed with the light by using a photomask. The organic resin film is developed using a TMAH (tetramethyl ammonium hydroxide)-based developing solution, the substrate is dried, and then the baking is performed at 220° C. for approximately one hour. As shown in FIG. 12B, the opening portion is formed in the organic resin film 522, and the first inorganic insulating film 521 is partially exposed in the opening portion.

Since the positive photosensitive acrylic is colored to be light brown, it is decolorized in the case where the light is emitted from the light-emitting element to the substrate side. In this case, the developed photosensitive acrylic is entirely exposed with light again before the baking. The exposure is performed so that the photosensitive acrylic is exposed completely by extending the exposure time longer or by irradiating with the light having higher intensity than the former exposure for forming the opening portion. For example, in the case of decolorizing the positive acrylic resin having a thickness of 2 μm with the use of an equivalent-magnification projecting exposure system (specifically MPA manufactured by Canon Inc.), which utilizes multiwavelengths including a g-line (436 nm), an h-line (405 nm), and an i-line (365 nm) all of which are in the spectrum of light emitted from super-high pressure mercury lamp, the exposure is performed for approximately 60 seconds. This exposure decolorizes the positive acrylic resin completely.

Although the baking is performed at 220° C. after the development in this embodiment, low-temperature prebaking at approximately 100° C. may be performed between the high-temperature baking at 220° C. and the development.

Then, a second inorganic insulating film 523 is formed of silicon nitride by an RF sputtering so as to cover the organic resin film 522 and the opening portion where the first inorganic insulating film 521 is exposed partially. The thickness of the second inorganic insulating film 523 preferably ranges from approximately 10 to 200 nm. The material of the second inorganic insulating film is not limited to silicon nitride, and any inorganic insulating film including nitride that can suppress the access of the moisture to the organic resin film 522 may be used. For example, silicon oxynitride, aluminum nitride, or aluminum oxynitride can be used.

In the case of using the silicon oxynitride or the aluminum oxynitride, the proportion between oxygen and nitrogen significantly affects its barrier property. The higher the proportion of nitrogen to oxygen is, the higher the barrier property is. Therefore, it is preferable that the aluminum oxynitride includes more nitrogen than oxygen.

The film formed by the RF sputtering method is highly dense and superior in barrier property. The condition in the RF sputtering method is that the gas flow rate of $N_2$, Ar, and $N_2O$ is 31:5:4 using a Si target, the pressure is 0.4 Pa, and the electric power is 3000 W. As another example, in the case of using silicon nitride, the condition is that the gas flow rate of $N_2$ and Ar in the chamber is 1:1, the pressure is 0.8 Pa, the electric power is 3000 W, and the film-forming temperature is 215° C.

The first interlayer insulating film is formed of the organic resin film 522, the first inorganic insulating film 521, and the second inorganic insulating film 523.

Figure 12C:
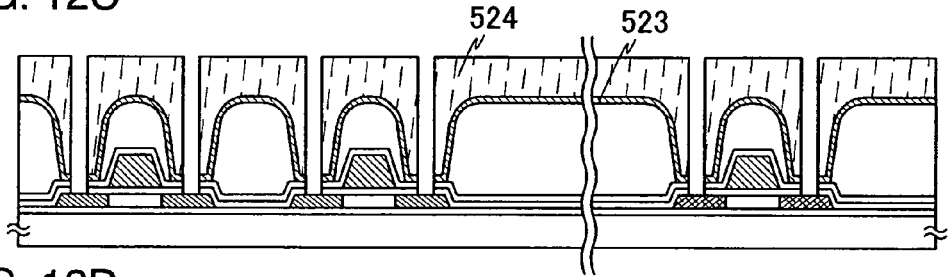

Next, as shown in FIG. 12C, a resist mask 524 is formed in the opening portion of the organic resin film 522, and a contact hole is formed to the gate insulating film 507, the first inorganic insulating film 521, and the second inorganic insulating film 523 by dry etching.

Due to the opening of this contact hole, the impurity regions 512 to 515, 518, and 519 are partially exposed. The condition of the dry etching is determined appropriately depending on the material of the gate insulating film 507, the first inorganic insulating film 521, and the second inorganic insulating film 523. Since the gate insulating film 507 is formed of silicon oxide, the first inorganic insulating film 521 is formed of silicon oxynitride, and the second inorganic insulating film 523 is formed of silicon nitride in this embodiment, the first inorganic insulating film 521 and the second inorganic insulating film 523 are etched by using $CF_4$, $O_2$, and He as the etching gas, and then the gate insulating film 507 is etched by using $CHF_3$.

It is important that the organic resin film 522 is not exposed in the opening portion when being etched.

Figure 12D:
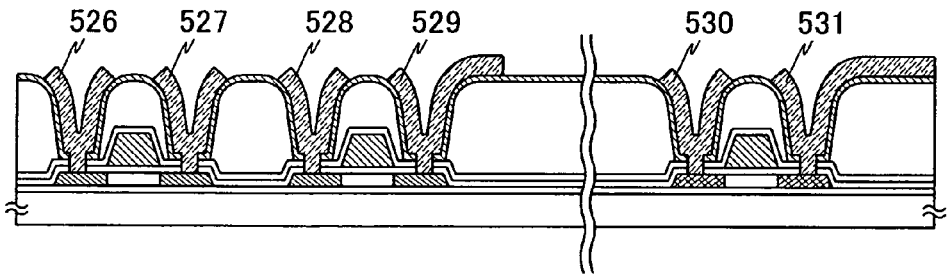

Next, wirings 526 to 531 connected to the impurity regions 512 to 515, 518, and 519 are formed by forming and patterning a conductive film over the second inorganic insulating film 523 so as to cover the contact hole (FIG. 12D).

Although three conductive films are formed of a 100-nm-thick Ti film, a 300-nm-thick Al film, and a 150-nm-thick Ti film continuously over the second inorganic insulating film 523 by the sputtering method in this embodiment, the present invention is not limited to this. The conductive film may include a single layer, two layers, or four or more layers. The material of the conductive film is not limited to the above description.

As another example of the conductive film, after forming a Ti film, an Al film including Ti may be laminated thereover. Alternatively, after forming the Ti film, an Al film including W may be laminated thereover.

Next, an organic resin film to be a partition wall is formed over the second inorganic insulating film 523. Although a positive photosensitive acrylic is used in this embodiment, the present invention is not limited to this. In this embodiment, the organic resin film is formed by applying the positive photosensitive acrylic by the spin coating method and baking it. The thickness of the organic resin film is set in the range of approximately 0.7 to 5 μm (preferably 2 to 4 μm).

Figure 12E:
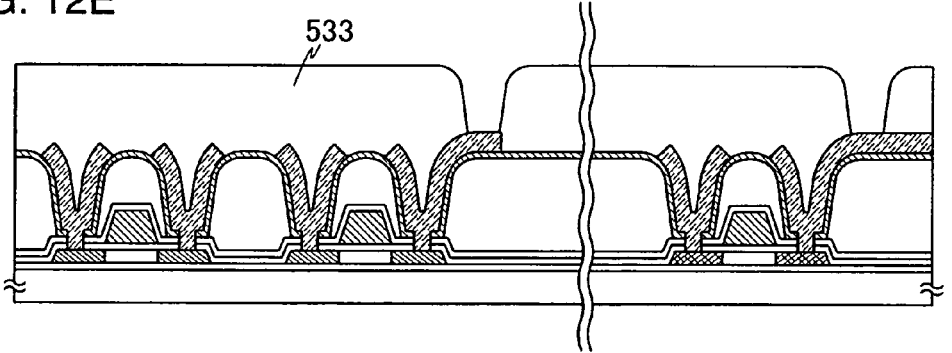

Next, a part of the organic resin film where the opening portion is formed is exposed with light with the use of the photomask. The organic resin film is developed using a TMAH (tetramethyl ammonium hydroxide)-based developing solution, the substrate is dried, and then the baking is performed at 220° C. for approximately one hour. Accordingly, as shown in FIG. 12E, an insulating film 533 having the opening portion is formed, and the wirings 529 and 531 are partially exposed in the opening portion.

Since the positive photosensitive acrylic is colored to be light brown, it is decolorized in the case where the light is emitted from the light-emitting element to the substrate side. The decolorization process is performed by the same procedure as that performed to the organic resin film 522.

When the insulating film 533 is formed of the photosensitive organic resin, the cross sectional shape of the opening portion can be made into round. Therefore, the coverage of the electroluminescent layer and the cathode to be formed afterward can be improved, and the defect in which the light-emitting region decreases, which is called shrink, can be decreased.

Subsequently, a third inorganic insulating film 534 is formed of silicon nitride by the RF sputtering method so as to cover the insulating film 533 and the opening portion where the wirings 529 and 531 are partially exposed. The thickness of the third inorganic insulating film 534 is preferably from 10 to 200 nm. The material of the third inorganic insulating film 534 is not limited to silicon nitride, and an inorganic insulating material including nitride that can suppress the access of the moisture to the insulating film 533 may be used. For example, silicon oxynitride, aluminum nitride, or aluminum oxynitride can be used.

In the case of using the silicon oxynitride or the aluminum oxynitride, the proportion between oxygen and nitrogen in atomic % significantly affects its barrier property. The higher the proportion of nitrogen to oxygen is, the higher the barrier property is. Therefore, it is preferable that the aluminum oxynitride includes more nitrogen than oxygen.

Next, a resist mask 535 is formed in the opening portion of the insulating film 533, and then a contact hole is formed to the third inorganic insulating film 534 by the dry etching method.

Due to the opening of the contact hole, the wirings 529 and 531 are partially exposed. The condition of the dry etching is determined in accordance with the material of the third inorganic insulating film 534. Since the third inorganic insulating film 534 is formed of silicon nitride, the third inorganic insulating film 534 is etched by using $CF_4$, $O_2$, and He as the etching gas.

It is important that the insulating film 533 is not exposed in the opening portion when being etched.

Figure 13A:
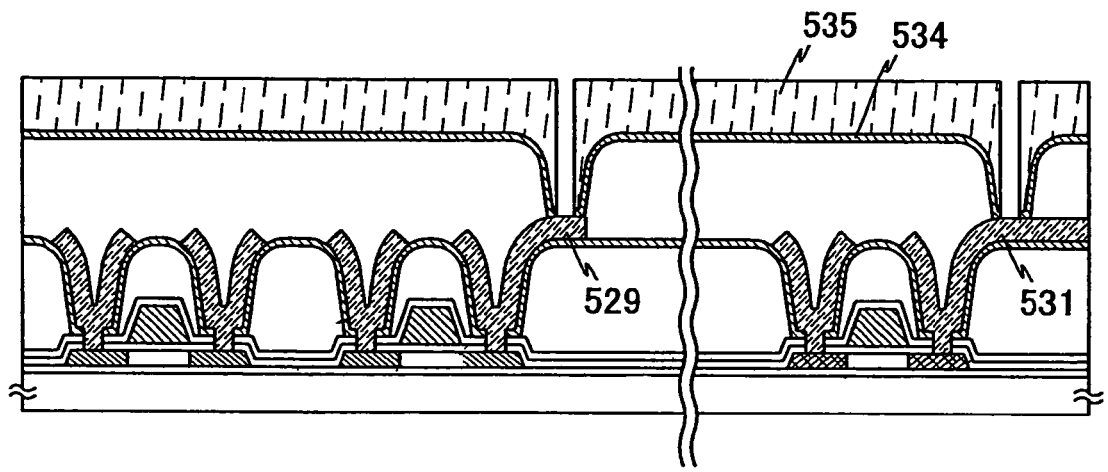
FIGS. 13A and 13B are drawings of processes for manufacturing a semiconductor device with the use of a laser irradiation method of the present invention.
Figure 13B:
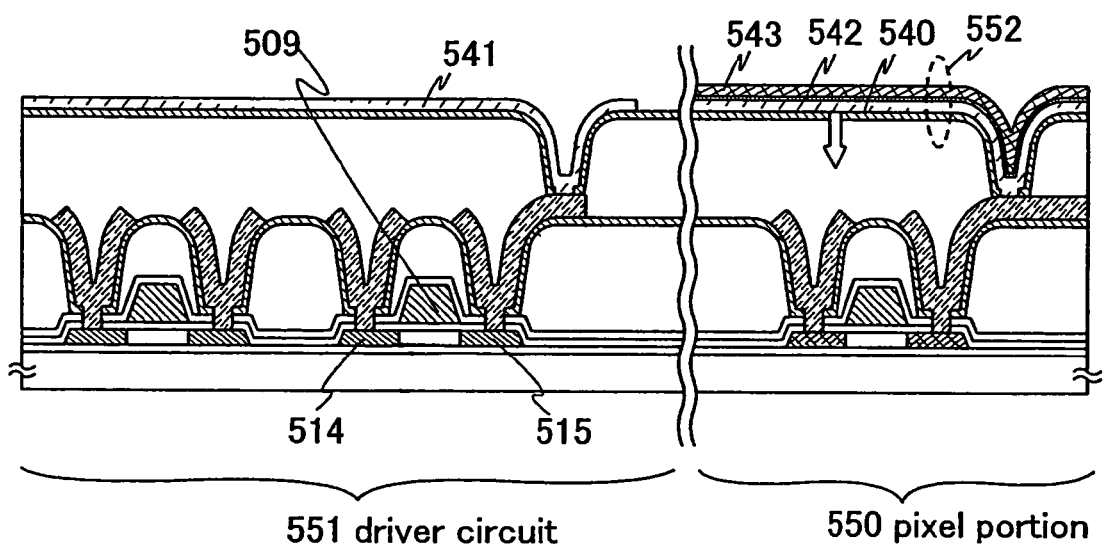

Next, a pixel electrode 540 in contact with the wiring 531 and a lead wiring 541 to obtain the current generated in the diode are formed by forming and patterning a 110-nm-thick ITO film, for example. A transparent conductive film in which zinc oxide (ZnO) is mixed into indium oxide by 2 to 20% may be used. The pixel electrode 540 will serve as the anode of the light-emitting element (FIG. 13B).

Next, an electroluminescent layer 542 is formed over the pixel electrode 540 by the evaporation method, and a cathode (MgAg electrode) 543 is formed by the evaporation method. In this step, it is desirable to remove the moisture completely by heat treatment to the pixel electrode 540 before forming the electroluminescent layer 542 and the cathode 543. Although the MgAg electrode is used as the cathode of the light-emitting element, another known material having low work function, for example Ca, CaF, MgAg, or AlLi, may be used.

When the cathode is formed of AlLi, the third inorganic insulating film 534 including nitrogen can prevent Li in AlLi from entering beyond the third inorganic insulating film 534 toward the substrate side.

A known material can be used as the electroluminescent layer 542. Although the electroluminescent layer includes two layers of a hole-transporting layer and a light-emitting layer in this embodiment, any one of or a plurality of a hole-injecting layer, an electron-injecting layer, and an electron-transporting layer may be also provided. Various examples have been already reported concerning these combinations, and any constitution may be employed. For example, SAlq, CAlq, or the like may be used as the electron-transporting layer or the hole-blocking layer.

The thickness of the electroluminescent layer 542 may be set in the range of 10 to 400 nm (typically 60 to 150 nm), and the thickness of the cathode 543 may be set in the range of 80 to 200 nm (typically 100 to 150 nm).

Thus, a light-emitting device having a structure shown in FIG. 13B is completed. In FIG. 13B, a reference numeral 550 denotes a pixel portion and a reference numeral 551 denotes a driver circuit portion. The part of the pixel portion 550 where the pixel electrode 540, the electroluminescent layer 542, and the cathode 543 overlap corresponds to the light-emitting element 552.

It is noted that the structure of the TFT and the specific manufacturing method describe in this embodiment is just an example. The present invention is not limited to the description of this embodiment.

After the process up to FIG. 13B are completed, it is preferable to package (enclose) with a protective film (a laminated film, an ultraviolet curable resin film, or the like) that is highly dense and that hardly degasses or with a light-transmitting cover member so that the element is not exposed to the air. In this step, the reliability of light-emitting element can be enhanced when the inside of the cover member is filled with inert atmosphere or when a material having moisture-absorption property (such as barium oxide) is provided inside.

This embodiment can be combined with any one of the embodiment modes 1 to 3 and the embodiments 1 and 2.

Embodiment 4

As electronic instruments manufactured by using the method for manufacturing a semiconductor device of the present invention, there are a video camera, a digital camera, a goggle type display (head mount display), a navigation system, a sound reproduction device (a car audio, an audio compo, and the like), a computer, a game machine, a mobile information terminal (a mobile computer, a mobile phone, a mobile game machine, an electronic book, and the like), an image reproduction device with a recording medium (specifically, a device for playing the recording medium such as DVD (digital versatile disc) that is equipped with a display for displaying the image), and so on. FIGS. 14A to 14H show the specific examples of these electronic instruments.

Figure 14A:
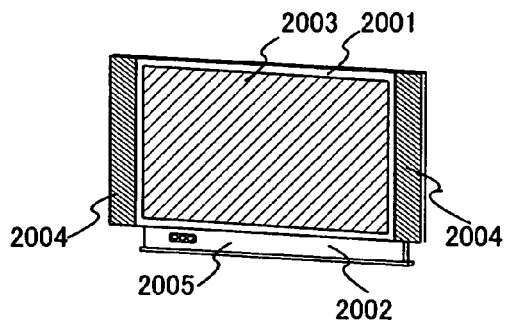
FIGS. 14A to 14H are drawings of electronic instruments manufactured by a method for manufacturing a semiconductor device of the present invention.

FIG. 14A shows a television receiver machine including a chassis 2001, a supporting stand 2002, a display portion 2003, a speaker portion 2004, a video input terminal 2005, and the like. The television receiver machine can be manufactured by applying the laser irradiation apparatus and the method for manufacturing the semiconductor device with the use of the laser irradiation apparatus described in any one of the above embodiment modes and embodiments to the process of the display portion 2003 and the like.

Figure 14B:
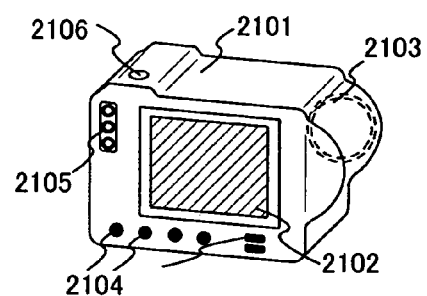

FIG. 14B shows a digital camera including a main body 2101, a display portion 2102, an image receiver portion 2103, an operation key 2104, an external connection port 2105, a shutter 2106, and the like. The digital camera can be manufactured by applying the laser irradiation apparatus and the method for manufacturing the semiconductor device with the use of the laser irradiation apparatus described in any one of the above embodiment modes and embodiments to the processes of the display portion 2102, the circuits, and the like.

Figure 14C:
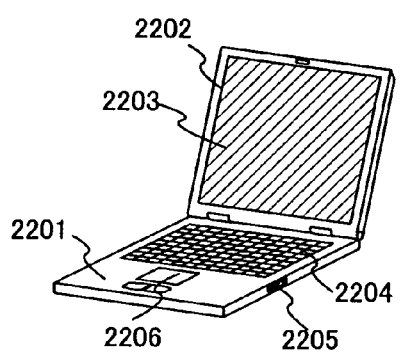

FIG. 14C shows a computer including a main body 2201, a chassis 2202, a display portion 2203, a keyboard 2204, an external connection port 2205, a pointing mouse 2206, and the like. The computer can be manufactured by applying the laser irradiation apparatus and the method for manufacturing the semiconductor device with the use of the laser irradiation apparatus described in any one of the above embodiment modes and embodiments to the processes of the display portion 2203, the circuits, and the like.

Figure 14D:
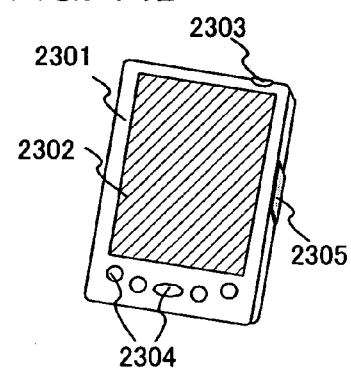

FIG. 14D shows a mobile computer including a main body 2301, a display portion 2302, a switch 2303, an operation key 2304, an infrared port 2305, and the like. The mobile computer can be manufactured by applying the laser irradiation apparatus and the method for manufacturing the semiconductor device with the use of the laser irradiation apparatus described in any one of the above embodiment modes and embodiments to the processes of the display portion 2302, the circuits, and the like.

Figure 14E:
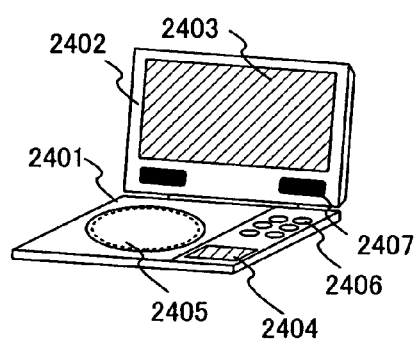

FIG. 14E shows a mobile image reproduction device with a recording medium equipped (such as a DVD reproduction device) including a main body 2401, a chassis 2402, a display portion A2403, a display portion B2404, a recording-medium reader portion 2405, an operation key 2406, a speaker portion 2407, and the like. The display portion A2403 mainly displays image information, while the display portion B2404 mainly displays text information. The image reproduction device can be manufactured by applying the laser irradiation apparatus and the method for manufacturing the semiconductor device with the use of the laser irradiation apparatus described in any one of the above embodiment modes and embodiments to the processes of the display portions A2403, B2404, the circuits, and the like. The image reproduction device includes the game machine and the like.

Figure 14F:
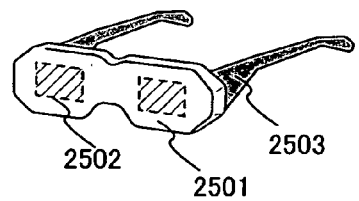

FIG. 14F shows a goggle type display (head mount display) including a main body 2501, a display portion 2502, and an arm portion 2503. The goggle type display can be manufactured by applying the laser irradiation apparatus and the method for manufacturing the semiconductor device with the use of the laser irradiation apparatus described in any one of the above embodiment modes and embodiments to the processes of the display portion 2502, the circuits, and the like.

Figure 14G:
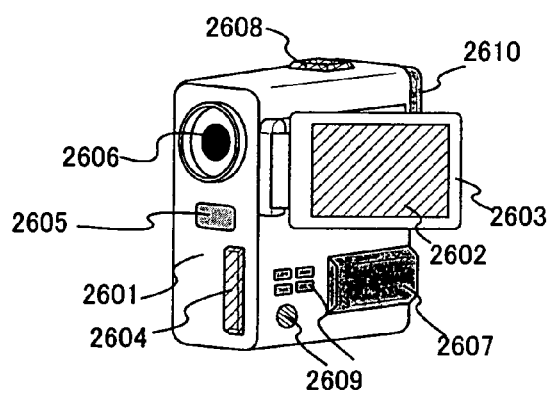

FIG. 14G shows a video camera including a main body 2601, a display portion 2602, a chassis 2603, an external connection port 2604, a remote controller receiving portion 2605, an image receiver portion 2606, a battery 2607, an audio input portion 2608, an operation key 2609, an eyepiece portion 2601, and the like. The video camera can be manufactured by applying the laser irradiation apparatus and the method for manufacturing the semiconductor device with the use of the laser irradiation apparatus described in any one of the above embodiment modes and embodiments to the processes of the display portion 2602, the circuits, and the like.

Figure 14H:
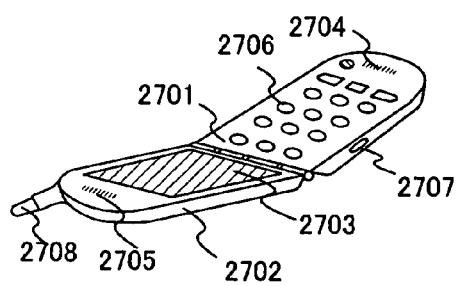

FIG. 14H shows a mobile phone including a main body 2701, a chassis 2702, a display portion 2703, an audio input portion 2704, an audio output portion 2705, an operation key 2706, an external connection port 2707, an antenna 2708, and the like. The mobile phone can be manufactured by applying the laser irradiation apparatus and the method for manufacturing the semiconductor device with the use of the laser irradiation apparatus described in any one of the above embodiment modes and embodiments to the processes of the display portion 2703, the circuits, and the like.

In addition to the above electronic instruments, a front type or rear type projector may be manufactured by applying the present invention.

As thus described, the present invention can be applied in a wide range, thereby being applicable to the electronic instruments of every field.

What is claimed is:

1. A method for manufacturing a semiconductor device comprising:
    shaping a laser beam emitted from a laser oscillator into an elongate beam spot having a short side and a long side on a surface of an irradiation object provided over a scanning stage; and
    annealing the irradiation object by moving the scanning stage relative to the laser beam in the long-side direction and the short-side direction of the elongate beam spot while oscillating the laser beam;
    wherein the irradiation object is moved more slowly in the long-side direction of the elongate beam spot than in the short-side direction of the elongate beam spot,
    wherein an irradiation position of the laser beam in the irradiation object is controlled by detecting a marker formed over the irradiation object, and
    wherein the marker has a short side parallel to the long-side direction of the elongate beam spot, and a long side parallel to the short-side direction of the elongate beam spot.

2. A method for manufacturing a semiconductor device comprising:
    shaping a first laser beam emitted from a first laser oscillator into an elongate beam spot having a short side and a long side on a surface of an irradiation object provided over a scanning stage; and
    annealing the irradiation object by moving the scanning stage relative to the first laser beam in the long-side direction and the short-side direction of the elongate beam spot while oscillating the surface of the irradiation object with the first laser beam;
    wherein the irradiation object is moved more slowly in the long-side direction of the elongate beam spot than in the short-side direction of the elongate beam spot,
    wherein an irradiation position of the first laser beam in the irradiation object is controlled by making a second laser beam incident into a surface of the irradiation object where a marker is formed and by detecting the second laser beam transmitted through the marker with the use of a photodetector, and
    wherein the marker has a short side parallel to the long-side direction of the elongate beam spot, and a long side parallel to the short-side direction of the elongate beam spot.

3. A method for manufacturing a semiconductor device comprising:

shaping a first laser beam emitted from a first laser oscillator into an elongate beam spot having a short side and a long side on a surface of an irradiation object provided over a scanning stage; and annealing the irradiation object by moving the scanning stage relative to the first laser beam in the long-side direction and the short-side direction of the elongate beam spot while oscillating the surface of the irradiation object with the first laser beam;

wherein the irradiation object is moved more slowly in the long-side direction of the elongate beam spot than in the short-side direction of the elongate beam spot, wherein an irradiation position of the first laser beam in the irradiation object is controlled in such a way that a second laser beam emitted from a second laser oscillator is divided into a plurality of laser beams by an optical element, that the plurality of laser beams are made incident into a marker formed over the irradiation object, and that the plurality of laser beams transmitted through the marker are detected by an array photodetector, and wherein the marker has a short side parallel to the long-side direction of the elongate beam spot, and a long side parallel to the short-side direction of the elongate beam spot.

4. A method for manufacturing a semiconductor device comprising:

shaping a first laser beam emitted from a laser oscillator into an elongate beam spot having a short side and a long side on a surface of an irradiation object provided over a scanning stage, and annealing the irradiation object by moving the scanning stage relative to the first laser beam in the long-side direction and the short-side direction of the elongate beam spot while oscillating the surface of the irradiation object with the first laser beam, wherein the irradiation object is moved more slowly in the long-side direction of the elongate beam spot than in the short-side direction of the elongate beam spot, wherein an irradiation position of the first laser beam in the irradiation object is controlled in such a way that after a second laser beam is made incident into a surface of the irradiation object where a marker is formed, the second laser beam reflected on the marker is detected by a photodetector, and wherein the marker has a short side parallel to the long-side direction of the elongate beam spot, and a long side parallel to the short-side direction of the elongate beam spot.

5. A method for manufacturing a semiconductor device comprising:

shaping a first laser beam emitted from a first laser oscillator into an elongate beam spot having a short side and a long side on a surface of an irradiation object provided over a scanning stage, and annealing the irradiation object by moving the scanning stage relative to the first laser beam in the long-side direction and the short-side direction of the elongate beam spot while oscillating the surface of the irradiation object with the first laser beam, wherein the irradiation object is moved more slowly in the long-side direction of the elongate beam spot than in the short-side direction of the elongate beam spot, wherein an irradiation position of the first laser beam in the irradiation object is controlled in such a way that after a second laser beam emitted from a second laser oscillator is divided into a plurality of laser beams by an optical element, the plurality of laser beams reflected on a marker formed over the irradiation object is detected by an array photodetector, and wherein the marker has a short side parallel to the long-side direction of the elongate beam spot, and a long side parallel to the short-side direction of the elongate beam spot.

6. The method for manufacturing a semiconductor device according to claim 2, wherein an irradiation starting position of the first laser beam is determined by image processor means.

7. The method for manufacturing a semiconductor device according to claim 3, wherein an irradiation starting position of the first laser beam is determined by image processor means.

8. The method for manufacturing a semiconductor device according to claim 4, wherein an irradiation starting position of the first laser beam is determined by image processor means.

9. The method for manufacturing a semiconductor device according to claim 5, wherein an irradiation starting position of the first laser beam is determined by image processor means.

10. The method for manufacturing a semiconductor device according to claim 6, wherein the image processor means comprises a CCD camera.

11. The method for manufacturing a semiconductor device according to claim 7, wherein the image processor means comprises a CCD camera.

12. The method for manufacturing a semiconductor device according to claim 8, wherein the image processor means comprises a CCD camera.

13. The method for manufacturing a semiconductor device according to claim 9, wherein the image processor means comprises a CCD camera.

14. The method for manufacturing a semiconductor device according to claim 5, wherein an irradiation starting position of the first laser beam is determined in such a way that two or more second laser beams are emitted from two or more second laser oscillators in different positions respectively, that each of the second laser beams is divided into a plurality of laser beams by an optical element, and that the plurality of laser beams reflected on a marker formed over the irradiation object are detected by an array photodetector simultaneously in two different positions.

15. The method for manufacturing a semiconductor device according to claim 1, wherein movement of the irradiation object relative to the laser beam in the long-side direction of the elongate beam spot is controlled by detecting the marker which is elongate in the short-side direction of the elongate beam spot.

16. The method for manufacturing a semiconductor device according to claim 2, wherein movement of the irradiation object relative to the first laser beam in the long-side direction of the elongate beam spot is controlled by detecting the marker which is elongate in the short-side direction of the elongate beam spot.

17. The method for manufacturing a semiconductor device according to claim 3, wherein movement of the irradiation object relative to the first laser beam in the long-side direction of the elongate beam spot is controlled by detecting the marker which is elongate in the short-side direction of the elongate beam spot.

18. The method for manufacturing a semiconductor device according to claim 4,
wherein movement of the irradiation object relative to the first laser beam in the long-side direction of the elongate beam spot is controlled by detecting the marker which is elongate in the short-side direction of the elongate beam spot.

19. The method for manufacturing a semiconductor device according to claim 5,
wherein movement of the irradiation object relative to the first laser beam in the long-side direction of the elongate beam spot is controlled by detecting the marker which is elongate in the short-side direction of the elongate beam spot.

20. The method for manufacturing a semiconductor device according claim 15,
wherein the movement of the irradiation object relative to the laser beam in the long-side direction of the elongate beam spot is controlled by moving the scanning stage so as to be parallel to the short side of the marker.

21. The method for manufacturing a semiconductor device according claim 16,
wherein the movement of the irradiation object relative to the first laser beam in the long-side direction of the elongate beam spot is controlled by moving the scanning stage so as to be parallel to the short side of the marker.

22. The method for manufacturing a semiconductor device according claim 17,
wherein the movement of the irradiation object relative to the first laser beam in the long-side direction of the elongate beam spot is controlled by moving the scanning stage so as to be parallel to the short side of the marker.

23. The method for manufacturing a semiconductor device according claim 18,
wherein the movement of the irradiation object relative to the first laser beam in the long-side direction of the elongate beam spot is controlled by moving the scanning stage so as to be parallel to the short side of the marker.

24. The method for manufacturing a semiconductor device according claim 19,
wherein the movement of the irradiation object relative to the first laser beam in the long-side direction of the elongate beam spot is controlled by moving the scanning stage so as to be parallel to the short side of the marker.

25. The method for manufacturing a semiconductor device according to claim 1,
wherein the laser oscillator is a YAG laser, a $YVO_4$ laser, a $GdVO_4$ laser, a YLF laser, or an Ar laser.

26. The method for manufacturing a semiconductor device according to claim 2,
wherein the first laser oscillator is a YAG laser, a $YVO_4$ laser, a $GdVO_4$ laser, a YLF laser, or an Ar laser.

27. The method for manufacturing a semiconductor device according to claim 3,
wherein the first laser oscillator is a YAG laser, a $YVO_4$ laser, a $GdVO_4$ laser, a YLF laser, or an Ar laser.

28. The method for manufacturing a semiconductor device according to claim 4,
wherein the first laser oscillator is a YAG laser, a $YVO_4$ laser, a $GdVO_4$ laser, a YLF laser, or an Ar laser.

29. The method for manufacturing a semiconductor device according to claim 5,
wherein the first laser oscillator is a YAG laser, a $YVO_4$ laser, a $GdVO_4$ laser, a YLF laser, or an Ar laser.

30. The method for manufacturing a semiconductor device according to claim 1,
wherein the elongate beam spot is a rectangular, linear, or elliptical beam spot.

31. The method for manufacturing a semiconductor device according to claim 2,
wherein the elongate beam spot is a rectangular, linear, or elliptical beam spot.

32. The method for manufacturing a semiconductor device according to claim 3,
wherein the elongate beam spot is a rectangular, linear, or elliptical beam spot.

33. The method for manufacturing a semiconductor device according to claim 4,
wherein the elongate beam spot is a rectangular, linear, or elliptical beam spot.

34. The method for manufacturing a semiconductor device according to claim 5,
wherein the elongate beam spot is a rectangular, linear, or elliptical beam spot.

35. The method for manufacturing a semiconductor device according to claim 1,
wherein the irradiation object is moved relative to the laser beam in the short-side direction of the elongate beam spot at a speed from 100 mm/s to 20 m/s, and
wherein the irradiation object is moved relative to the laser beam in the long-side direction of the elongate beam spot at a speed less than 100 mm/s.

36. The method for manufacturing a semiconductor device according to claim 2,
wherein the irradiation object is moved relative to the first laser beam in the short-side direction of the elongate beam spot at a speed from 100 mm/s to 20 m/s, and
wherein the irradiation object is moved relative to the first laser beam in the long-side direction of the elongate beam spot at a speed less than 100 mm/s.

37. The method for manufacturing a semiconductor device according to claim 3,
wherein the irradiation object is moved relative to the first laser beam in the short-side direction of the elongate beam spot at a speed from 100 mm/s to 20 m/s, and
wherein the irradiation object is moved relative to the first laser beam in the long-side direction of the elongate beam spot at a speed less than 100 mm/s.

38. The method for manufacturing a semiconductor device according to claim 4,
wherein the irradiation object is moved relative to the first laser beam in the short-side direction of the elongate beam spot at a speed from 100 mm/s to 20 m/s, and
wherein the irradiation object is moved relative to the first laser beam in the long-side direction of the elongate beam spot at a speed less than 100 mm/s.

39. The method for manufacturing a semiconductor device according to claim 5,
wherein the irradiation object is moved relative to the first laser beam in the short-side direction of the elongate beam spot at a speed from 100 mm/s to 20 m/s, and
wherein the irradiation object is moved relative to the first laser beam in the long-side direction of the elongate beam spot at a speed less than 100 mm/s.

40. The method for manufacturing a semiconductor device according to claim 1,
wherein the detecting the marker is conducted during the irradiation object being moved in the long-side direction of the elongate beam spot.

41. The method for manufacturing a semiconductor device according to claim 2, wherein the detecting the marker is conducted during the irradiation object being moved in the long-side direction of the elongate beam spot.

42. The method for manufacturing a semiconductor device according to claim 3, wherein the detecting the marker is conducted during the irradiation object being moved in the long-side direction of the elongate beam spot.

43. The method for manufacturing a semiconductor device according to claim 4, wherein the detecting the marker is conducted during the irradiation object being moved in the long-side direction of the elongate beam spot.

44. The method for manufacturing a semiconductor device according to claim 5, wherein the detecting the marker is conducted during the irradiation object being moved in the long-side direction of the elongate beam spot.

* * * * *